United States Patent
Hunt et al.

(10) Patent No.: US 10,731,246 B2
(45) Date of Patent: Aug. 4, 2020

(54) ION BEAM SAMPLE PREPARATION AND COATING APPARATUS AND METHODS

(71) Applicant: Gatan, Inc., Pleasanton, CA (US)

(72) Inventors: John Andrew Hunt, Fremont, CA (US); Steven Thomas Coyle, Alameda, CA (US); Michael Patrick Hassel-Shearer, Little Haseley (GB); Thijs C Hosman, San Francisco, CA (US)

(73) Assignee: Gatan, Inc., Pleasonton, CA (US)

( * ) Notice: Subject to any disclaimer, the term of this patent is extended or adjusted under 35 U.S.C. 154(b) by 589 days.

(21) Appl. No.: 14/809,088

(22) Filed: Jul. 24, 2015

(65) Prior Publication Data
US 2016/0024645 A1   Jan. 28, 2016

Related U.S. Application Data

(60) Provisional application No. 62/029,563, filed on Jul. 28, 2014.

(51) Int. Cl.
*C23C 14/34*   (2006.01)
*C23C 14/46*   (2006.01)
(Continued)

(52) U.S. Cl.
CPC ............ *C23C 14/46* (2013.01); *C23C 14/022* (2013.01); *C23C 14/50* (2013.01); *C23C 14/505* (2013.01);
(Continued)

(58) Field of Classification Search
CPC ..................................................... C23C 14/46
See application file for complete search history.

(56) References Cited

U.S. PATENT DOCUMENTS 5,922,179 A * 7/1999 Mitro .................... C23C 14/022
                                                                 204/192.11
6,394,733 B1 * 5/2002 Toda ................. H01L 21/67017
                                                                      406/192
(Continued)

FOREIGN PATENT DOCUMENTS

JP     H04123254 U    11/1992
JP     2001507165 A    5/2001
(Continued)

OTHER PUBLICATIONS

International Search Report and Written Opinion dated Nov. 5, 2015 for International Application No. PCT/US2015/042149.

*Primary Examiner* — Jason Berman
(74) *Attorney, Agent, or Firm* — Snyder, Clark, Lesch & Chung LLP

(57) ABSTRACT

Disclosed are embodiments of an ion beam sample preparation and coating apparatus and methods. A sample may be prepared in one or more ion beams and then a coating may be sputtered onto the prepared sample within the same apparatus. A vacuum transfer device may be used with the apparatus in order to transfer a sample into and out of the apparatus while in a controlled environment. Various methods to improve preparation and coating uniformity are disclosed including: rotating the sample retention stage; modulating the sample retention stage; variable tilt ion beam irradiating means, more than one ion beam irradiating means, coating thickness monitoring, selective shielding of the sample, and modulating the coating donor holder.

13 Claims, 20 Drawing Sheets

(51) Int. Cl.
    *C23C 14/54*   (2006.01)
    *C23C 14/50*   (2006.01)
    *C23C 14/56*   (2006.01)
    *C23C 14/02*   (2006.01)
    *H01J 37/317*  (2006.01)
    *H01J 37/305*  (2006.01)

(52) U.S. Cl.
    CPC .......... *C23C 14/545* (2013.01); *C23C 14/566* (2013.01); *H01J 37/3053* (2013.01); *H01J 37/3178* (2013.01); *H01J 2237/0822* (2013.01); *H01J 2237/184* (2013.01); *H01J 2237/202* (2013.01); *H01J 2237/204* (2013.01); *H01J 2237/3146* (2013.01); *H01J 2237/3151* (2013.01)

(56) References Cited

U.S. PATENT DOCUMENTS

| | | | |
|---|---|---|---|
| 7,198,699 B2 | 4/2007 | Thomsen et al. | |
| 2004/0217268 A1 | 11/2004 | Alani | |
| 2004/0217286 A1* | 11/2004 | Alani | G01N 1/32 250/304 |
| 2005/0006231 A1* | 1/2005 | Fischer | C23C 14/46 204/298.04 |
| 2007/0246356 A1* | 10/2007 | Tokimitsu | C23C 14/3464 204/298.02 |
| 2012/0015195 A1 | 1/2012 | Wang et al. | |
| 2012/0085938 A1* | 4/2012 | Coyle | G01N 1/32 250/492.3 |
| 2013/0340036 A1 | 12/2013 | Furukawa | |
| 2013/0340936 A1 | 12/2013 | Giannuzzi | |
| 2014/0157914 A1 | 6/2014 | Fischione et al. | |

FOREIGN PATENT DOCUMENTS

| | | |
|---|---|---|
| JP | 2004087342 A | 3/2004 |
| JP | 4123254 B2 | 7/2008 |
| WO | 2014018694 A2 | 1/2014 |

* cited by examiner

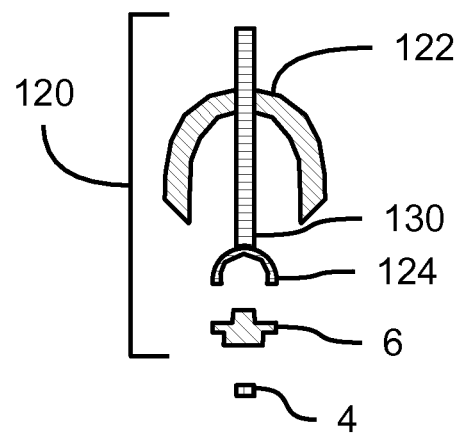
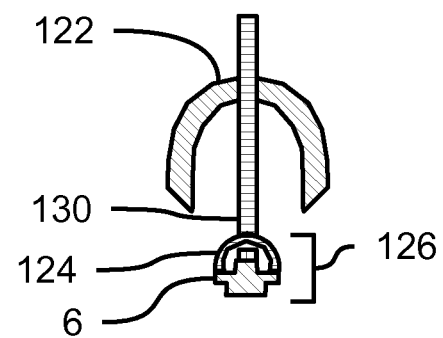
FIG 6A
FIG 6B
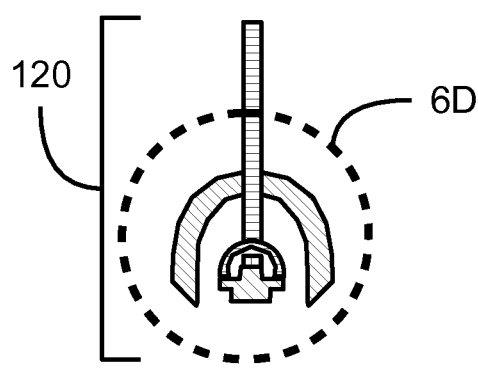
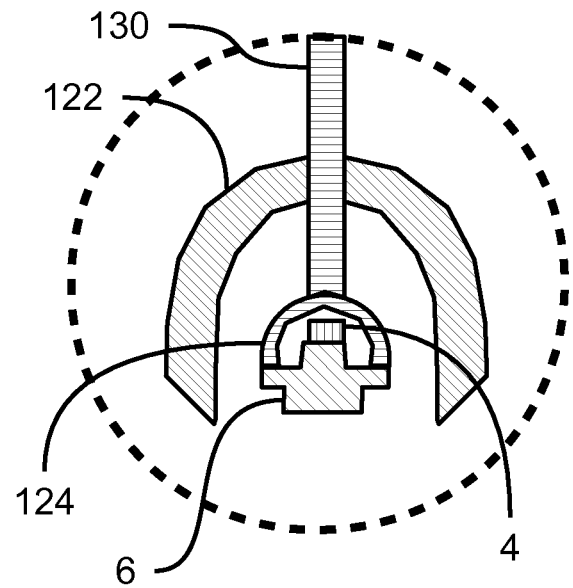
FIG 6C
FIG 6D

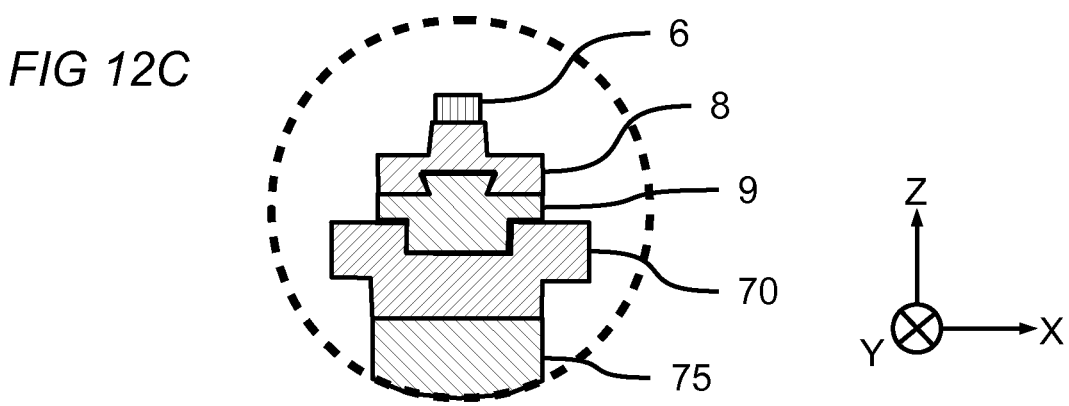
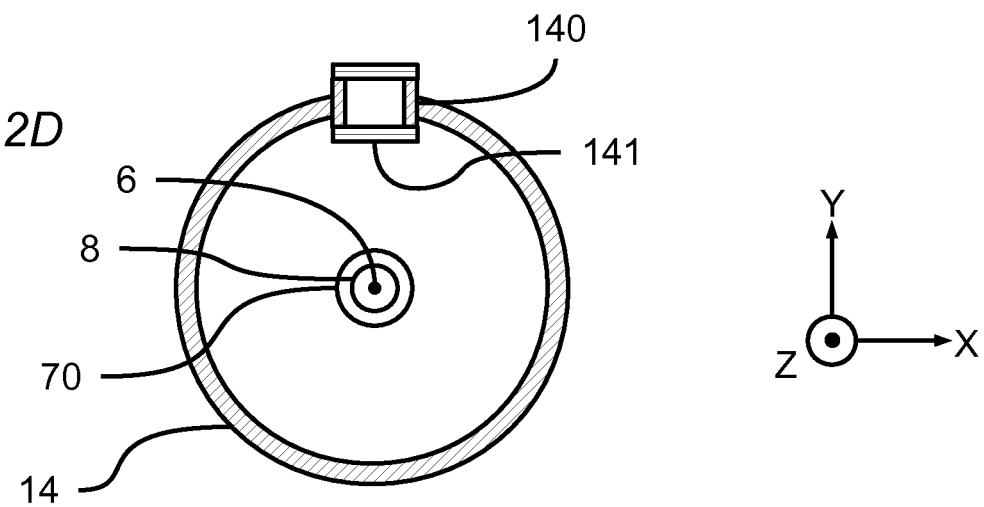
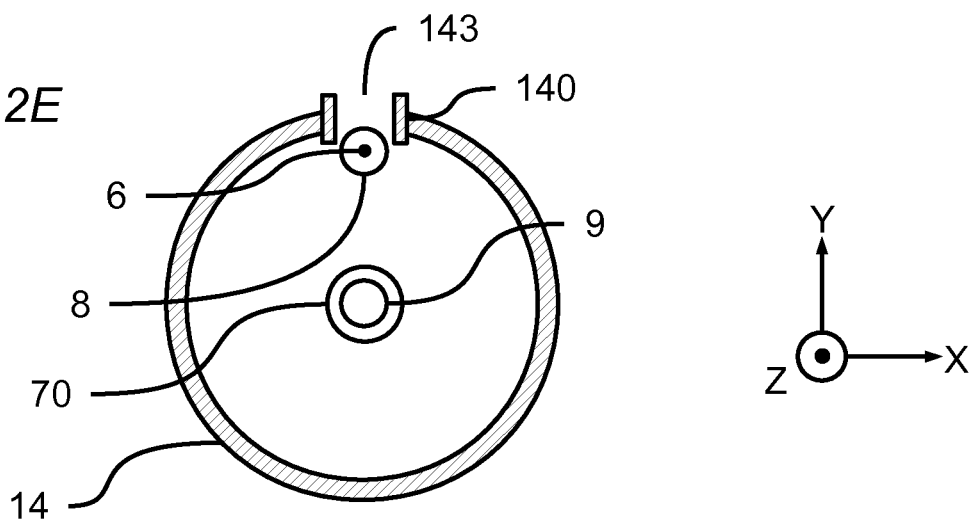

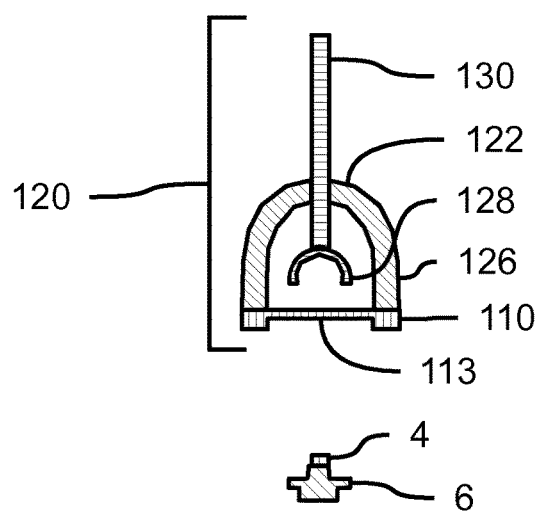
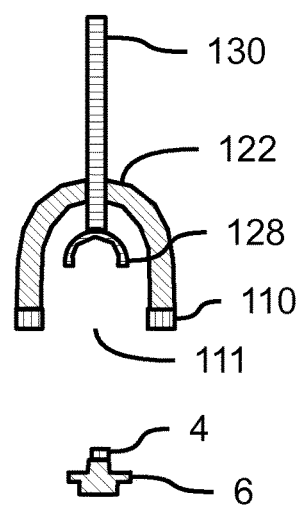
FIG 13A
FIG 13B
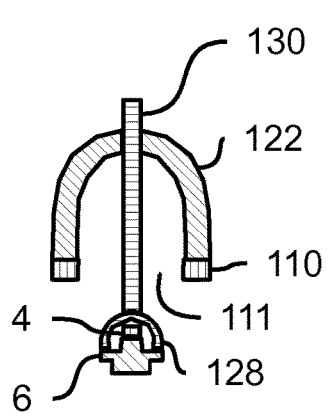
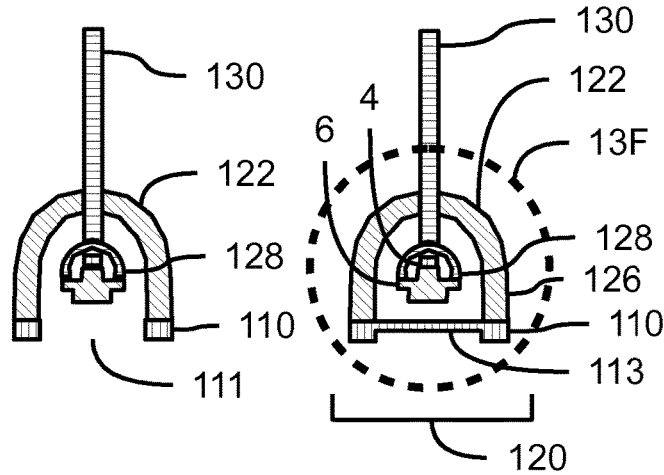
FIG 13C
FIG 13D
FIG 13E
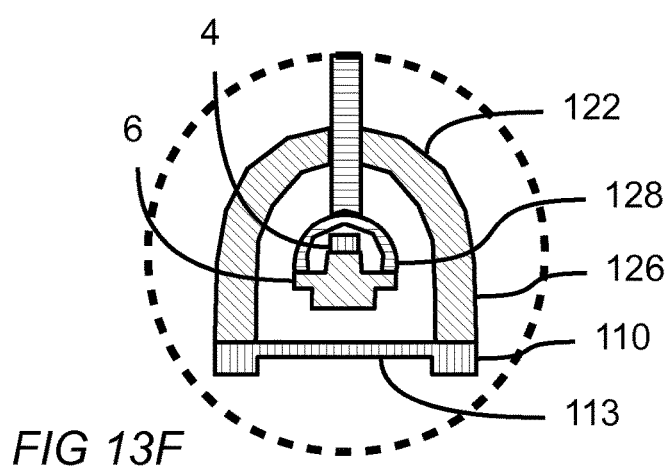
FIG 13F

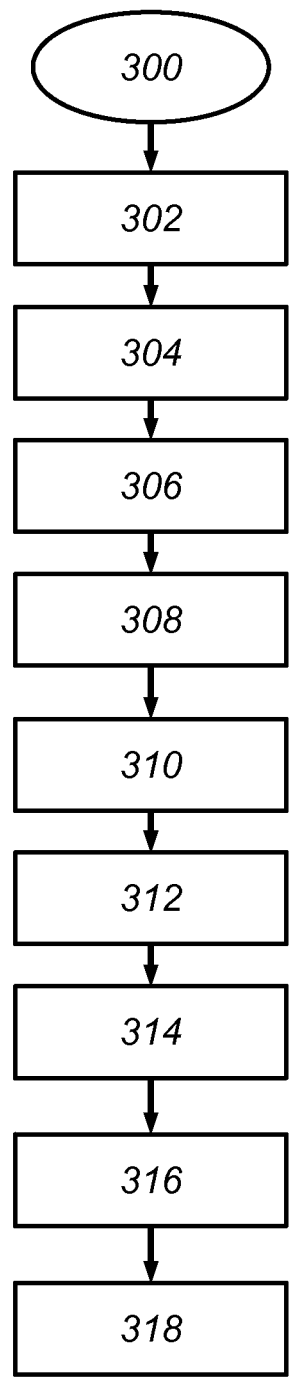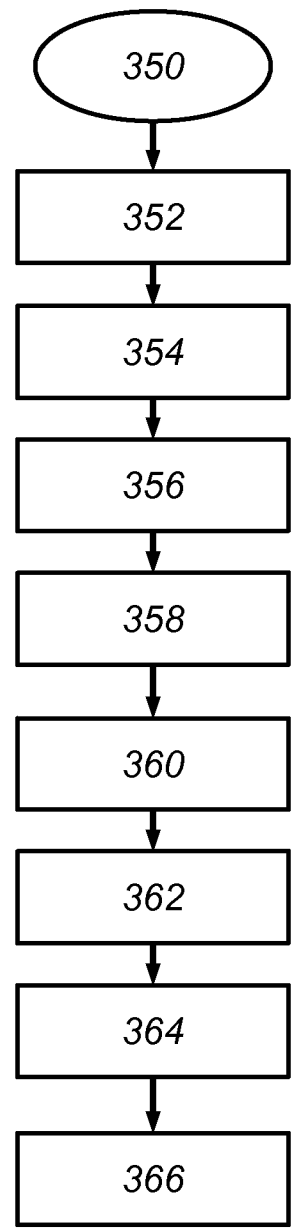
FIG 15A                                    FIG 15B

ION BEAM SAMPLE PREPARATION AND COATING APPARATUS AND METHODS

CROSS REFERENCE TO RELATED APPLICATIONS

This non-provisional utility application claims the benefit of provisional Application No. 62/029,563, filed Jul. 28, 2014, entitled "Ion Beam Sample Preparation and Coating Apparatus". Application No. 62/029,563 is incorporated herein by reference.

STATEMENT REGARDING FEDERALLY SPONSORED RESEARCH OR DEVELOPMENT

Not Applicable.

DESCRIPTION OF ATTACHED APPENDIX

Not Applicable.

BACKGROUND

The present disclosure relates to the use of one or more ion beams to prepare materials for microscopic observation or spectroscopic analysis. Microscopic observational techniques include, but are not limited to, optical light microscopy (LM), scanning electron microscopy (SEM), transmission electron microscopy (TEM), scanning transmission electron microscopy (STEM), and reflection electron microscopy (REM). Spectroscopic analysis techniques include, but are not limited to, x-ray microanalysis, reflection electron energy-loss spectroscopy (REELS), electron back-scattered diffraction (EBSD), x-ray photoelectron spectroscopy (XPS), and Auger electron spectroscopy (AES). Materials to be viewed under any microscopic technique may require processing to produce a sample suitable for microscopic examination.

Microscopies making use of electrons to probe and image samples are important techniques for studying the detailed microstructure of many materials. The preparation of these samples for observation is very demanding. The goals of sample preparation are: preserve as many salient sample features as possible; avoid artifacts that might change, lose, or add additional information; render the sample stable for examination, in an observational environment, that may be carried out within a range of temperatures, vacuum conditions, and charged and neutral particle fluxes; and, to enable the observation of the sample as near to its natural state as possible.

Ion beam milling of a material can produce samples that are well suited for microscopic examination. Ion beam milling may be employed during sample preparation to thin, smooth, expose, and etch regions of interest in the sample for later microscopic study. An ion beam irradiating device may generate, accelerate, and direct a beam of ions toward a sample. The impact of ions on the sample will sputter material away from the area of ion impact. The sample surface may be polished by the ion beam to a substantially smooth condition, further enhancing observational properties of the sample. Regions of interest in the sample may be exposed and polished by the use of ion beams, thus making a suitable observational sample from the material under investigation. Furthermore, a sample may be etched by the action of one or more ion beams and may thereby be prepared to accept a coating on its surface.

Coating a sample with a carefully chosen coating material can produce samples with observational characteristics better than those achievable from the intrinsic properties of the sample material alone. Thin coatings of carbon, metals such as: gold; chromium; platinum; palladium; iridium; tungsten; tantalum, and other compounds can be used to coat a prepared sample and thereby produce changes in: conductivity; charge accumulation during observation; edge resolution during observation; thermal damage; secondary electron emission; backscattered electron emission; and mechanical stability.

Ion beam systems used to mill samples destined for microscopic analysis typically expose an interface, or underlying structure of interest, or produce a sample with an electron-transparent region. Many of these systems have rotating samples and fixed beams, so that the beams may strike the sample from multiple directions. This provides for more uniform milling of a sample by compensating for the shadowing of certain regions that may happen due to the nonuniform topology of the sample surface. In the typical system used for ion beam milling, material is removed most quickly from the sample by the ion beam in the region of the sample described by the intersection of the rotation axis of the sample with the center of the ion beam itself.

Important considerations to users of ion beam milling techniques include: reducing or minimizing the time and effort the user is occupied in processing the sample; reducing or minimizing the number of steps where delicate samples are directly handled and at risk for damage, such as during mounting to sample holders for processing or analysis; reducing or minimizing the time and effort the user is occupied transferring the sample into the ultimate analysis equipment (imaging or spectroscopy) and aligning the coordinates of the prepared sample region to the ultimate analysis equipment prior to analysis; ensuring high quality and high probability of success in processing and imaging the sample; reducing or minimizing the time that the ion milling equipment and sample mounting equipment are occupied for each sample; and ensuring high-quality microscopy observation of the sample during sample mounting and ultimate analysis by reducing the working distance required between the sample and the objective or probe-forming lens used for observation.

Important considerations with respect to coating a sample with a coating material that enhances its properties during subsequent microscopic observation include: improving the spatial uniformity of coating; reducing the time required to coat a sample; improving the repeatability of the coating step; controlling the coating thickness; and improving the efficiency of the coating step.

In consideration of the foregoing points, it is clear that embodiments of the present disclosure confer numerous advantages, and are therefore highly desirable.

SUMMARY

A summary of embodiments follows in which various features may be grouped together in a single embodiment for the purpose of streamlining the disclosure. This method of disclosure is meant to be illustrative of the teachings of the present disclosure and is not to be interpreted as reflecting that the claimed embodiments have more features than are expressly recited in each claim. Inventive subject matter may lie in less than all of the features disclosed in a single embodiment. Moreover, the scope of embodiments now described should be determined with reference to the appended claims along with the full scope of equivalents to which the claims in the present application are entitled.

Concept 1: An ion beam apparatus for preparing a sample and coating said sample with a coating material according to a concept of the present disclosure comprises:
- a first ion beam irradiating means disposed in a vacuum chamber directing a first ion beam along a first central ion beam axis;
- a coating donor translation stage operable to move between a sputtering position and a quiescent position, said coating donor translation stage coupled to a coating donor holder, said coating donor holder configured to hold said coating material;
  - said sputtering position characterized in that said coating donor holder positions a portion of said coating material in the path of said first central ion beam axis, the interaction of said first ion beam with said coating material creating a sputtered coating material in said vacuum chamber;
  - said quiescent position characterized in that said coating donor holder positions none of said coating material in the path of said first central ion beam axis;
- a sample retention stage configured to releasably retain a sample holder which holds said sample in a predetermined position and orientation with respect to said first central ion beam axis, said sample retention stage having: a lifting axis; and a lifting drive;
  - the lifting drive operable to move said sample retention stage along said lifting axis between a milling position and a coating position;
    - said milling position characterized in that said sample retention stage is positioned to hold at least a portion of said sample in the path of said first central ion beam axis;
    - said coating position characterized in that said sample retention stage is positioned so that none of said sample intersects said first central ion beam axis and further characterized in that at least a portion of said sample is positioned to receive a coating portion of said sputtered coating material present in said vacuum chamber.

Concept 2 (adding second ion beam): concept 1 additionally comprising:
- a second ion beam irradiating means disposed in said vacuum chamber directing a second ion beam along a second central ion beam axis;
- said sputtering position further characterized in that said coating donor holder positions a portion of said coating material in the path of said second central ion beam axis, the interaction of said second ion beam with said coating material creating a sputtered coating material in said vacuum chamber;
- said quiescent position further characterized in that said coating donor holder positions none of said coating material in the path of said second central ion beam axis;
- said milling position further characterized in that said sample retention stage is positioned to hold at least a portion of said sample in the path of said second central ion beam axis;
- said coating position further characterized in that said sample retention stage is positioned so that none of said sample intersects said second ion beam central axis.

Concept 3 (ion beam tilt): concept 1 further characterized in that the first central ion beam axis has a tilt angle with respect to said lifting axis of said sample retention stage, the apparatus additionally comprising a tilt drive operably coupled to the first ion beam irradiating means and configured to move the direction of said first central ion beam axis between at least two different tilt angles.

Concept 4 (adding sputtering shield to protect sample while cleaning the coating donor): concept 1 additionally comprising:
- a sputtering shield having both a shielding position and a non-shielding position;
  - said shielding position characterized in that said sputtering shield substantially prevents said sample from receiving any of said sputtered coating material present in said vacuum chamber when said sample retention stage is in said coating position;
  - said non-shielding position characterized in that said coating portion of said sputtered coating material is received by said sample when said sample retention stage is in said coating position;
  - said sputtering shield being operable to move between said shielding position and said non-shielding position when said sample retention stage is in said coating position.

Concept 5 (adding rotation to sample retention stage): An ion beam apparatus for preparing a sample and coating said sample with a coating material according to a concept of the present disclosure comprises:
- a first ion beam irradiating means disposed in a vacuum chamber directing a first ion beam along a first central ion beam axis;
- a coating donor translation stage operable to move between a sputtering position and a quiescent position, said coating donor translation stage coupled to a coating donor holder, said coating donor holder configured to hold said coating material;
  - said sputtering position characterized in that said coating donor holder positions a portion of said coating material in the path of said first central ion beam axis, the interaction of said first ion beam with said coating material creating a sputtered coating material in said vacuum chamber;
  - said quiescent position characterized in that said coating donor holder positions none of said coating material in the path of said first central ion beam axis;
- a rotating sample retention stage configured to releasably retain a sample holder which holds said sample in a predetermined position and orientation with respect to said first central ion beam axis, said sample retention stage having: a lifting axis; and a lifting drive; and a rotation axis;
  - the lifting drive operable to move said rotating sample retention stage along said lifting axis between a milling position and a coating position
    - said milling position characterized in that said rotating sample retention stage is positioned to hold at least a portion of said sample in the path of said first central ion beam axis;
    - said coating position characterized in that none of said sample intersects said first ion beam central axis and further characterized in that at least a portion of said sample is positioned to receive a coating portion of said sputtered coating material present in said vacuum chamber;
  - said rotating sample retention stage operable to rotate said sample about said rotation axis for at least a portion of one rotation.

Concept 6 (adding a load lock where sample holder enters the vacuum chamber): An ion beam apparatus for preparing a sample and coating said sample with a coating material according to a concept of the present disclosure comprises:

- a first ion beam irradiating means disposed in a vacuum chamber directing a first ion beam along a first central ion beam axis;
- a coating donor translation stage operable to move between a sputtering position and a quiescent position, said coating donor translation stage coupled to a coating donor holder, said coating donor holder configured to hold said coating material;
  - said sputtering position characterized in that said coating donor holder positions a portion of said coating material in the path of said first central ion beam axis, the interaction of said first ion beam with said coating material creating a sputtered coating material in said vacuum chamber;
  - said quiescent position characterized in that said coating donor holder positions none of said coating material in the path of said first central ion beam axis;
- a sample retention stage configured to releasably retain a sample holder which holds said sample in a predetermined position and orientation with respect to said first central ion beam axis, said sample retention stage having: a lifting axis; and a lifting drive;
- said sample holder configured to hold said sample in a predetermined position and orientation;
- the lifting drive operable to move said sample retention stage along said lifting axis between a milling position and a coating position
  - said milling position characterized in that said sample retention stage is positioned to hold at least a portion of said sample in the path of said first central ion beam axis;
  - said coating position characterized in that said sample retention stage is positioned so that none of said sample intersects said first ion beam central axis and further characterized in that at least a portion of said sample is positioned to receive a coating portion of said sputtered coating material present in said vacuum chamber;
- a first gate valve operable to move between a gate-open position and a gate-closed position;
  - said gate-closed position characterized in that a substantially vacuum-tight loading chamber is created between the closed first gate valve and a portion of the vacuum chamber; said gate-closed position further characterized in that a substantially vacuum-tight seal is created between the loading chamber and the portion of the vacuum chamber in which the ion beam irradiating means is disposed;
  - said gate-open position characterized in that said sample holder can pass through said first gate valve;
- a vacuum pumping means coupled to a first vacuum manifold and configured to evacuate and maintain vacuum pressure in said loading chamber, said vacuum pumping means also coupled to a second vacuum manifold and configured to evacuate and maintain vacuum pressure in said vacuum chamber.

Concept 7A (a system comprising ion beam sample preparation apparatus and vacuum transfer device): a system for transferring a sample to and from an ion beam sample preparation apparatus comprises the apparatus of concept 6 and additionally comprises:

- a vacuum transfer device having: an outer vacuum bell, an inner vacuum bell, and a transfer means;
  - said outer vacuum bell being configured to removeably mount to said loading chamber thereby creating a vacuum-tight seal;
  - said inner vacuum bell sized to fit inside of said outer vacuum bell and configured to create a vacuum-tight seal against said sample holder thereby creating a transfer chamber sized to isolate both said sample and a portion of said sample holder from the environment;
  - said transfer means being operable to complete both a loading sequence and an unloading sequence while said outer vacuum bell is mounted to said loading chamber;
  - said loading sequence comprising the steps of: moving said inner vacuum bell from said loading chamber towards said sample retention stage; urging the engagement of said sample holder with said sample retention stage; urging the disengagement of inner vacuum bell from said sample holder; and moving said inner vacuum bell back to said loading chamber;
  - said unloading sequence comprising the steps of: moving said inner vacuum bell from said loading chamber towards said sample retention stage; urging the engagement of said sample holder with said inner vacuum bell; urging the disengagement of said sample holder from said sample retention stage; and moving said inner vacuum bell back to said loading chamber.

Concept 7B (a system comprising ion beam sample preparation apparatus and vacuum transfer device according to another concept): a system for transferring a sample to and from an ion beam sample preparation apparatus comprises the apparatus of concept 6 and additionally comprises:

- a vacuum transfer device having: an outer vacuum bell coupled to a second gate valve, an inner gripper coupled to a transfer means;
  - said inner gripper sized to fit inside of said outer vacuum bell and configured to releasably retain said sample holder within an interior portion of said outer vacuum bell;
  - said second gate valve coupled to said outer vacuum bell and having both a second gate-closed position and a second gate-open position;
  - said second gate-closed position characterized in that a substantially vacuum-tight transfer chamber is created between the closed second gate valve and an interior portion of the outer vacuum bell;
  - said second gate-open position characterized in that said inner gripper can pass through said second gate valve;
  - said outer vacuum bell being configured to removeably mount to said loading chamber thereby creating a vacuum-tight seal;
  - said transfer means being operable to complete both a loading sequence and an unloading sequence while said outer vacuum bell is mounted to said loading chamber;
  - said loading sequence comprising the steps of: moving said inner gripper from said loading chamber towards said sample retention stage; urging the engagement of said sample holder with said sample retention stage; urging the disengagement of inner gripper from said sample holder; and moving said inner gripper back to said loading chamber;

said unloading sequence comprising the steps of: moving said inner gripper from said loading chamber towards said sample retention stage; urging the engagement of said sample holder with said inner gripper; urging the disengagement of said sample holder from said sample retention stage; and moving said inner gripper back to said loading chamber.

Concept 8 (adding a third position, i.e. a loading position, to the sample retention stage): An ion beam apparatus for preparing a sample and coating said sample with a coating material according to a concept of the present disclosure comprises:

a first ion beam irradiating means disposed in a vacuum chamber directing a first ion beam along a first central ion beam axis;

a coating donor translation stage operable to move between a sputtering position and a quiescent position, said coating donor translation stage coupled to a coating donor holder, said coating donor holder configured to hold said coating material;

said sputtering position characterized in that said coating donor holder positions a portion of said coating material in the path of said first central ion beam axis, the interaction of said first ion beam with said coating material creating a sputtered coating material in said vacuum chamber;

said quiescent position characterized in that said coating donor holder positions none of said coating material in the path of said first central ion beam axis;

a sample retention stage configured to hold said sample and having: a lifting axis; a lifting drive;

the lifting drive operable to move said sample retention stage along said lifting axis between: a loading position; a milling position; and a coating position, said loading position characterized in that a substantially vacuum-tight loading chamber is created between the sample retention stage and a portion of the vacuum chamber, said loading position further characterized in that a substantially vacuum-tight seal is created between the loading chamber and the portion of the vacuum chamber in which the ion beam irradiating means is disposed;

said milling position characterized in that said sample retention stage is positioned to hold at least a portion of said sample in the path of said first central ion beam axis;

said coating position characterized in that none of said sample intersects said first ion beam central axis and further characterized in that at least a portion of said sample is positioned to receive a coating portion of said sputtered coating material present in said vacuum chamber;

a vacuum pumping means coupled to a first vacuum manifold and configured to evacuate and maintain vacuum pressure in said loading chamber, said vacuum pumping means also coupled to a second vacuum manifold and configured to evacuate and maintain vacuum pressure in said vacuum chamber.

Concept 9A (adding the ability to modulate the position or angle of the coating donor while in the coating position): concept 1 further characterized in that:

the coating donor holder is a modulating coating donor holder operable to modulate the position or orientation of said coating donor material when the coating donor translation stage is disposed in said sputtering position.

Concept 9B (adding the ability to modulate the position or angle of the sample being held in the coating position): concept 1 further characterized in that:

the sample retention stage is a modulating sample retention stage operable to modulate the position, orientation, or both position and orientation of the sample holder when modulating sample retention stage is in the coating position.

Concept 10 (adding coating thickness monitor): concept 1 additionally comprising:

a coating thickness monitor disposed in said vacuum chamber and having both a shielded position and a monitoring position;

said monitoring position characterized in that said coating thickness monitor is disposed to receive a monitoring portion of said sputtered coating material present in said vacuum chamber, said monitoring portion being proportional to said coating portion received by said sample;

said shielded position characterized in that said coating thickness monitor receives substantially none of said sputtered coating material present in said vacuum chamber.

Concept 11 (adding a secondary sample holder adapted to be transferred from sample prep chamber into other equipment directly): An ion beam apparatus for preparing a sample and coating said sample with a coating material according to a concept of the present disclosure comprises:

a first ion beam irradiating means disposed in a vacuum chamber directing a first ion beam along a first central ion beam axis;

a coating donor translation stage operable to move between a sputtering position and a quiescent position, said coating donor translation stage coupled to a coating donor holder, said coating donor holder configured to hold said coating material;

said sputtering position characterized in that said coating donor holder positions a portion of said coating material in the path of said first central ion beam axis, the interaction of said first ion beam with said coating material creating a sputtered coating material in said vacuum chamber;

said quiescent position characterized in that said coating donor holder positions none of said coating material in the path of said first central ion beam axis;

a sample retention stage configured to releasably retain a secondary sample holder, the sample retention stage having: a lifting axis and a lifting drive;

said secondary sample holder configured to releasably retain a primary sample holder in a predetermined position and orientation;

said primary sample holder configured to retain said sample in a predetermined position and orientation; said primary sample holder further characterized in that it can be released from said secondary sample holder without releasing said secondary sample holder from said sample retention stage;

the lifting drive operable to move said sample retention stage along said lifting axis between a milling position and a coating position;

said milling position characterized in that said sample retention stage is positioned to hold at least a portion of said sample in the path of said first central ion beam axis;

said coating position characterized in that said sample retention stage is positioned so that none of said sample intersects said first central ion beam axis and further characterized in that at least a portion of said sample is positioned to receive a coating portion of said sputtered coating material present in said vacuum chamber.

BRIEF DESCRIPTION OF THE DRAWINGS

These and other features, aspects, and advantages of the present invention will become better understood with regard to the following description, appended claims, and accompanying drawings where:

FIG. 6A, FIG. 6B, FIG. 6C, and FIG. 6D show a cross sectional schematic views of a vacuum transfer device for use with embodiments of the present disclosure.

FIG. 12A shows the sample retention stage in a milling position. FIG. 12B shows the sample retention stage in a coating position.

FIG. 12C shows an enlarged view of a portion of FIG. 12B showing primary sample holder being releasably retained by the secondary sample holder.

FIG. 12D shows a top down schematic cross sectional view of the apparatus of FIG. 12A, FIG. 12B, and FIG. 12C showing the transfer port disposed in the vacuum chamber in a port-closed position.

FIG. 12E shows a top down schematic cross sectional view of the apparatus of FIG. 12A, FIG. 12B, and FIG. 12C after primary sample holder is released from the secondary sample holder and has started being moved through the transfer port with the transfer port in a port-open position.

FIG. 13A, FIG. 13B, FIG. 13C, FIG. 13D, and FIG. 13E show cross sectional schematic views of a vacuum transfer device for use with embodiments of the present disclosure.

FIG. 13F shows an enlarged view of a portion of FIG. 13E.

FIG. 15A shows a flow diagram of process steps involved in a loading sequence using the system of FIGS. 13A-13F, and FIGS. 14A-14E.

FIG. 15B shows a flow diagram of process steps involved in an unloading sequence using the system of FIGS. 13A-13F, and FIGS. 14A-14E.

LIST OF REFERENCE NUMBERS APPEARING IN THE FIGURES

Figure 1A:
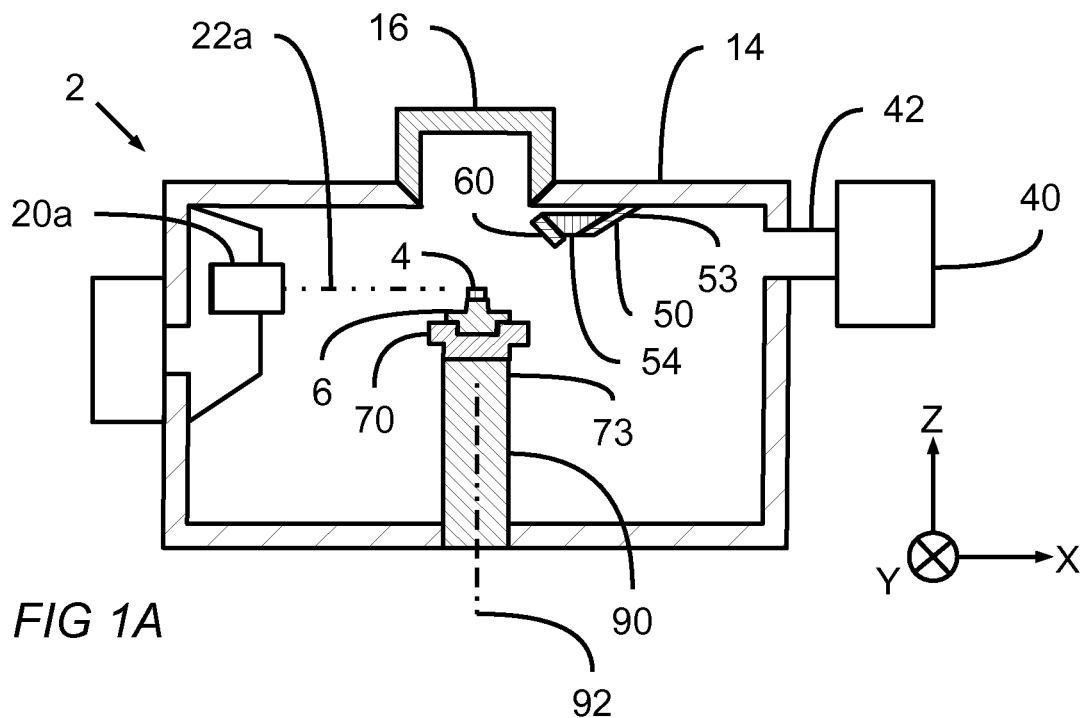
FIG. 1A shows a schematic cross sectional view of an ion beam sample preparation and coating apparatus according to the present disclosure. The figure shows sample retention stage in a milling position and coating donor translation stage in a quiescent position.

2—ion beam sample preparation and coating apparatus
4—sample
6—sample holder
8—primary sample holder
9—secondary sample holder 14—vacuum chamber
16—chamber cover
18—loading chamber
20—ion beam irradiating means
20a, 20b—first, second ion beam irradiating means, etc.
22—central ion beam axis
22a, 22b—first, second central ion beam axis, etc.
24—tilt angle
24a, 24b—first, second, tilt angle, etc.
28—tilt drive
40—vacuum pumping means
42—vacuum manifold
42a, 42b—first vacuum manifold, second vacuum manifold, etc.
44—vacuum valve
functions as part of the vacuum system to transmit vacuum across the valve when open and is vacuum-tight when closed
44a, 44b—first vacuum valve, second vacuum valve, etc.
50—coating donor translation stage
51—sputtering position
53—quiescent position
54—coating donor holder
56—modulating coating donor holder
60—coating material
62—sputtered coating material
64—coating portion
66—monitoring portion
70—sample retention stage
71—loading position
72—modulating sample retention stage
73—milling position
75—coating position
80—rotating sample retention stage
81—loading position
82—rotation axis
83—milling position
85—coating position
90—lifting drive
92—lifting axis
100—sputtering shield
101—shielding position
103—non-shielding position
110—gate valve
allows physical passage through an orifice when open and is vacuum-tight when closed
110a, 110b—first gate valve, second gate valve, etc
111—gate-open position
111a—gate-open position of first gate valve
111b—gate-open position of second gate valve
113—gate-closed position
113a—gate-closed position of first gate valve
113b—gate-closed position of second gate valve
120—vacuum transfer device
122—outer vacuum bell
124—inner vacuum bell
vacuum-tight seal is formed between inner vacuum bell and sample holder when complementary features on inner vacuum bell and sample holder are engaged
126—transfer chamber
128—inner gripper
130—transfer means
140—transfer port
141—port-closed position of the transfer port
143—port-open position of the transfer port
150—coating thickness monitor
151—shielded position
153—monitoring position
200—loading sequence
202, 204, 206, 208, 210, 212, 214, 216, etc.—process steps of loading sequence 200
250—unloading sequence
252, 254, 256, 258, 260, 262, 264, 266, etc.—process steps of unloading sequence 250
300—loading sequence
302, 304, 306, 308, 310, 312, 314, 316, 318, etc.—process steps of loading sequence 300
350—unloading sequence
352, 354, 356, 358, 360, 362, 364, 366, etc.—process steps of unloading sequence 350

DESCRIPTION

Embodiments of the present disclosure provide ion beam sample preparation and coating apparatus and associated methods for producing high-quality samples for microscopic observation. Broad Ion Beam Slope-Cutting (BIBSC), also known as cross-section cutting using broad ion beam sources, ion beam milling, ion beam etching, or cross-section polishing using broad ion beam sources, is a rapid method for removing sample material to expose a smooth and substantially artifact-free cross-sectional surface for ultimate analysis by various microscopies and spectroscopies. A notable advantage of the BIBSC technique is high rates of surface preparation that can exceed tens or hundreds or thousands of square microns per hour, often over sample milling times of tens or hundreds of minutes. Using a broad ion beam to create a sputtered coating on a sample that has been freshly prepared in an ion beam can enhance numerous observational characteristics and durability properties of a sample. Embodiments of the disclosure present numerous beneficial apparatus and methods for performing these and other procedures.

The disclosed improvements have the benefits of: reducing or minimizing the time and effort the user is occupied in processing the sample; reducing or minimizing the number of steps where delicate samples are directly handled and at risk for damage, such as during mounting to sample holders for processing or analysis; reducing or minimizing the time and effort the user is occupied transferring the sample into the ultimate analysis equipment (imaging or spectroscopy) and aligning the coordinates of the prepared sample region to the ultimate analysis equipment prior to analysis; ensuring high quality and high probability of success in processing and imaging the sample; reducing or minimizing the time that the ion milling equipment and sample mounting equipment are occupied for each sample; and ensuring high-quality microscopy observation of the sample during sample mounting and ultimate analysis by reducing the working distance required between the sample and the objective or probe-forming lens used for observation; improving the spatial uniformity of coating; reducing the time required to coat a sample; improving the repeatability of the coating step; controlling the coating thickness; and improving the efficiency of the coating step.

Figure 1B:
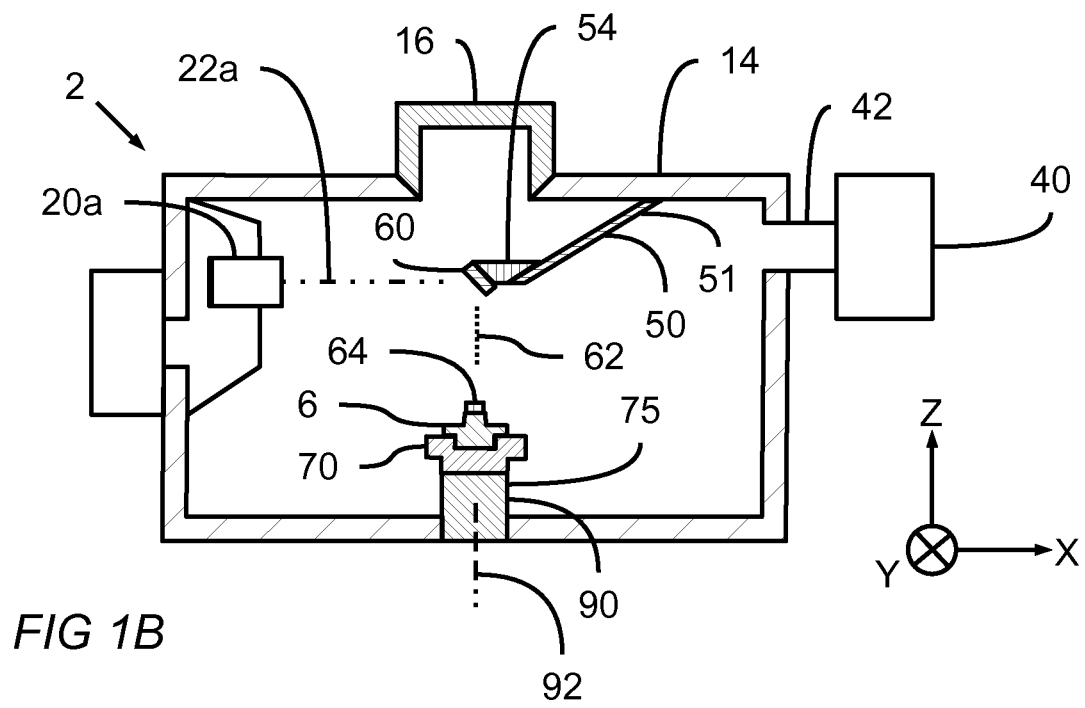
FIG. 1B shows a schematic cross sectional view of the same apparatus as FIG. 1A. The figure shows sample retention stage in a coating position and coating donor translation stage in a sputtering position.

Turning now to FIG. 1A and FIG. 1B, shown are views of an embodiment of an ion beam sample preparation and coating apparatus 2 for preparing a sample 4 and coating the sample with a coating material 60 according to an embodiment of the present disclosure comprises: a first ion beam irradiating means 20a disposed in a vacuum chamber 14 directing an ion beam along a first central ion beam axis 22a; a coating donor translation stage 50 which is operable to move between a sputtering position 51 and a quiescent position 53; coating donor translation stage 50 is coupled to a coating donor holder 54, with coating donor holder 54 configured to hold coating material 60; sputtering position 51 characterized in that the coating donor holder 54 positions a portion of coating material 60 in the path of first central ion beam axis 22a, the interaction of the ion beam with coating material 60 creating a sputtered coating material 62 in vacuum chamber 14; quiescent position 53 is characterized in that coating donor holder 54 positions none of coating material 60 in the path of first central ion beam axis 22a; also disposed in the vacuum chamber is a sample retention stage 70 configured to releasably retain a sample holder 6 which holds sample 4 in a predetermined position and orientation with respect to first central ion beam axis 22a. The apparatus also comprises: both a lifting drive 90 and a lifting axis 92; lifting drive 90 operable to move sample retention stage 70 along lifting axis 92 between a milling position 73 and a coating position 75; the milling position 73 characterized in that sample retention stage 70 is positioned to hold at least a portion of sample 4 in the path of first central ion beam axis 22a, and the coating position 75 characterized in that sample retention stage 70 is positioned so that none of sample 4 intersects first central ion beam axis 22a and further characterized in that at least a portion of sample 4 is positioned to receive a coating portion 64 of sputtered coating material 62 present in the vacuum chamber. Chamber cover 16 is vacuum-tight when in place on the vacuum chamber and is removable thereby providing access to sample retention stage 70 for the purposes of both loading and unloading sample holder from the apparatus. FIG. 1A shows sample retention stage 70 in milling position 73 and coating donor translation stage 50 in quiescent position 53. FIG. 1B shows sample retention stage 70 in coating position 75 and coating donor translation stage 50 in sputtering position 51.

In the embodiments of the present disclosure, broad ion beams preferably comprise noble gas ions. Non-noble gas ions may be used in other embodiments. Noble gas elements used for the ion beam may include but are not limited to: Argon, Xenon, and Krypton. The ion beam may also comprise a mixture of ions and neutrals. In other embodiments of the present disclosure ion beam intensity control means may be operative to control ion beam irradiating means such that one or more of the following properties of the ion beam may be controlled: energy of the ions produced, number of ions produced per unit time, divergence of the emitted ion beam, and spatial distribution and shape of the emitted ion beam. In certain preferred embodiments the ion beam irradiating means may produce a beam energy about in the range of 100 eV to 10 KeV, and beam current about in the range of 10 microAmps to 100 micro Amps.

Figure 2A:
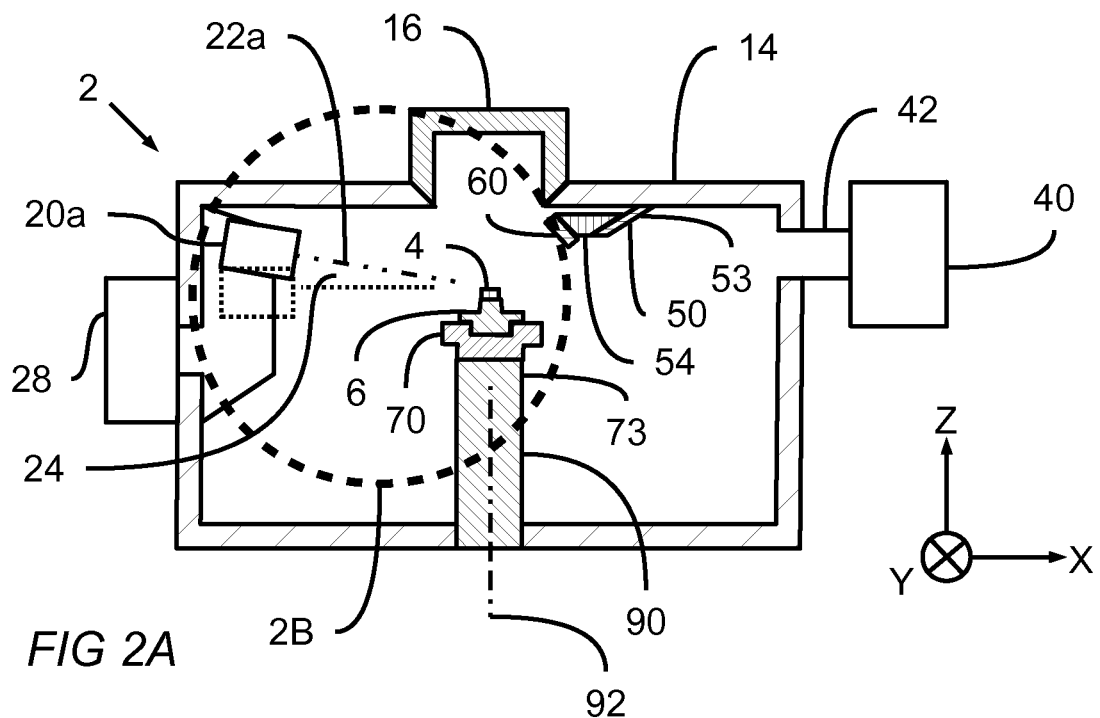
FIG. 2A shows a schematic cross sectional view of an ion beam sample preparation and coating apparatus according to another embodiment of the present disclosure in which the ion beam irradiating means has a variable tilt angle.
Figure 2B:
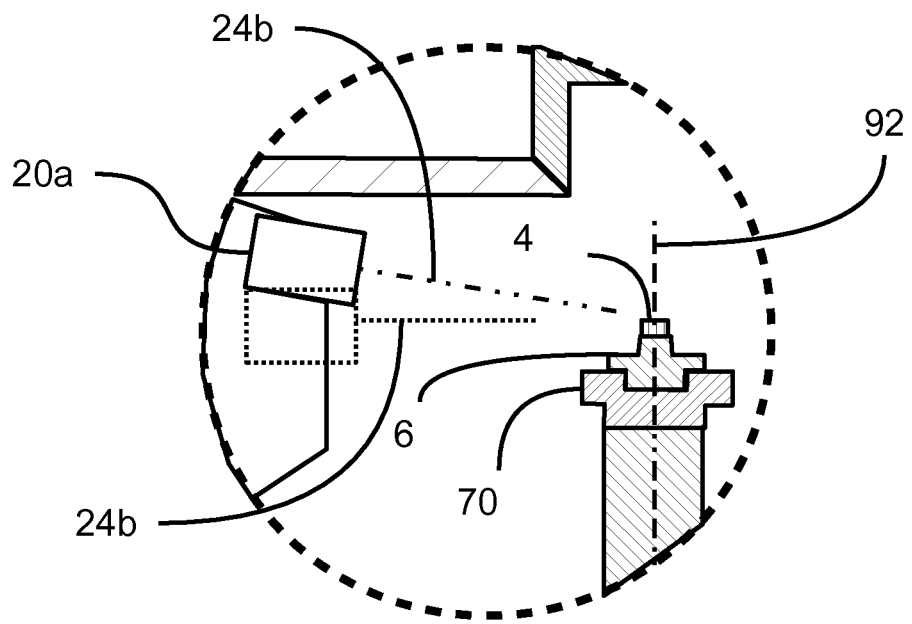
FIG. 2B shows an enlarged view of a portion of FIG. 2A showing multiple ion beam tilt angles.

As shown in FIG. 2A and FIG. 2B, the position and direction of first ion beam irradiating means 20a may be changed so that the angle of incidence of the central ion beam axis to the sample may be changed. In preferred embodiments the angle of incidence may have a range of about zero to about 20 degrees with respect to horizontal. Higher angles of incidence remove material from the sample more quickly while lower angles of incidence produce a smoother surface with fewer artifacts. It can be seen with reference to FIG. 1A and FIG. 1B in combination with FIG. 2A and FIG. 2B that the apparatus may be further characterized in that the first central ion beam axis 22a may have a tilt angle 24 with respect to lifting axis 92 of the sample retention stage. The apparatus may additionally comprise a tilt drive 28 operably coupled to the first ion beam irradiating means and configured to move the direction of the first central ion beam axis between at least two different angles, a first tilt angle 24a and second tilt angle 24b. Changing the tilt angle may have beneficial effects on both the milling process and the coating process. In preferred embodiments, the tilting action of the tilt drive and the disposition of the sample holder within the vacuum chamber may be configured so that the central ion beam axis may strike substantially the same location on the sample regardless of the tilt angle of the ion beam.

Figure 3A:
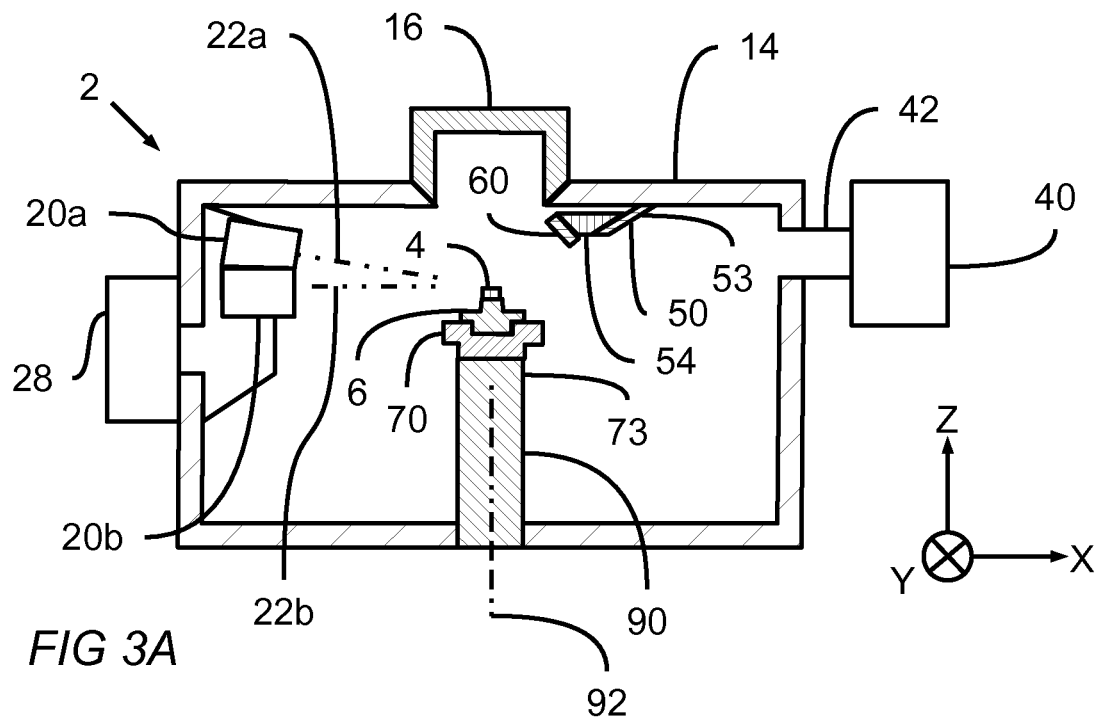
FIG. 3A shows a schematic cross sectional view of an ion beam sample preparation and coating apparatus according to the present disclosure in which the apparatus has more than one ion beam irradiating means. The figure shows sample retention stage in a milling position and coating donor translation stage in a quiescent position.
Figure 3B:
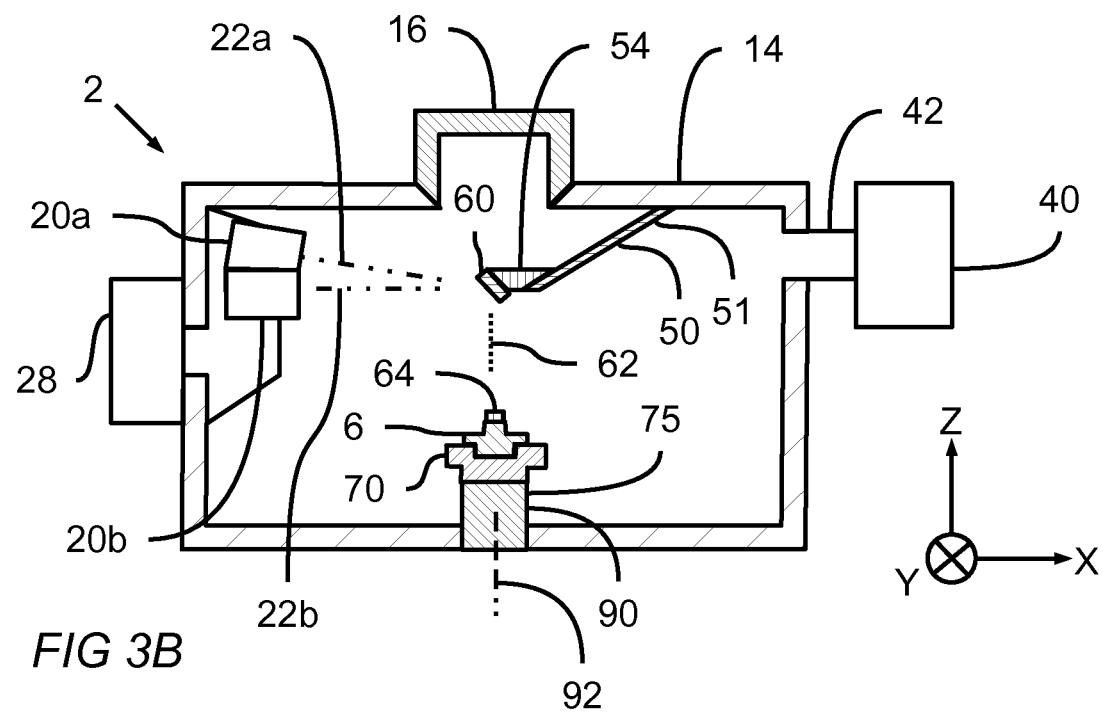
FIG. 3B shows a schematic cross sectional view of the same apparatus as FIG. 3A. The figure shows sample retention stage in a coating position and coating donor translation stage in a sputtering position.

Turning now to FIG. 3A and FIG. 3B, shown is an embodiment of an ion beam sample preparation and coating apparatus 2 for preparing a sample 4 and coating the sample with a coating material 60 according to an embodiment of the present disclosure comprising the apparatus of FIG. 1A and FIG. 1B and additionally comprising: a second ion beam irradiating means 20b disposed in vacuum chamber 14 directing a second ion beam along a second central ion beam axis 22b; sputtering position 51 further characterized in that coating donor holder 54 positions a portion of coating material 60 in the path of second central ion beam axis 22b, the interaction of the second ion beam with coating material 60 creating a sputtered coating material in vacuum chamber 14; quiescent position 53 further characterized in that coating donor holder 54 positions none of coating material 60 in the path of second central ion beam axis 22b; milling position 73 further characterized in that sample retention stage 70 is positioned to hold at least a portion of sample 4 in the path of second central ion beam axis 22b; and coating position 75 further characterized in that sample retention stage 70 is positioned so that none of sample 4 intersects second ion beam central axis 22b. FIG. 3A shows sample retention stage 70 in milling position 73 and coating donor translation stage 50 in quiescent position 53. FIG. 3B shows sample retention stage 70 in coating position 75 and coating donor translation stage 50 in sputtering position 51.

Figure 4A:
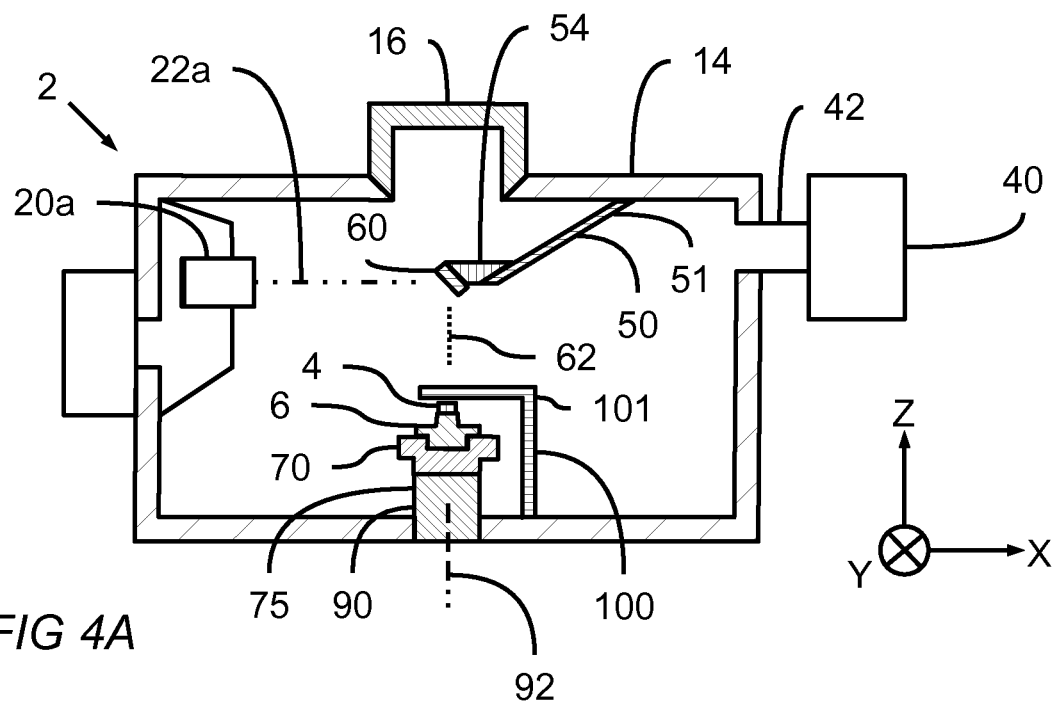
FIG. 4A shows a schematic cross sectional view of an ion beam sample preparation and coating apparatus according to the present disclosure in which the apparatus has a sputtering shield in a shielding position.
Figure 4B:
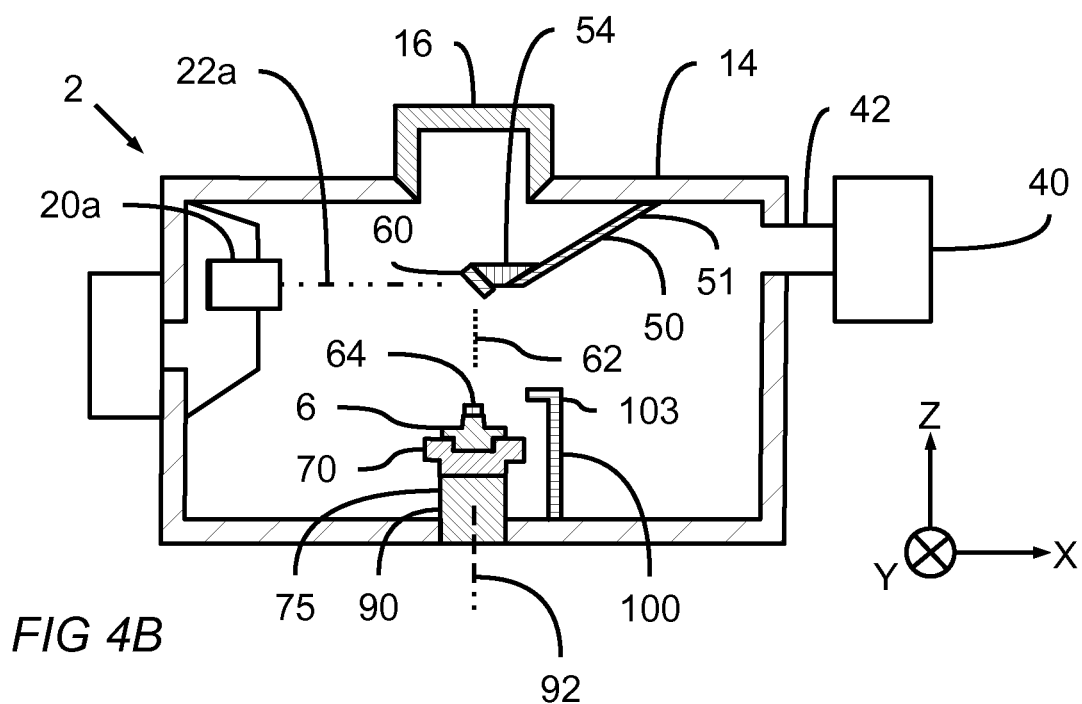
FIG. 4B shows a schematic cross sectional view of an ion beam sample preparation and coating apparatus according to the present disclosure in which the apparatus has a sputtering shield in a non-shielding position.

FIG. 4A and FIG. 4B now show further improvements to the embodiments previously described. A sputtering shield 100 can be used to protect the sample from receiving unwanted coating. It is sometimes desirable to clean the surface of coating material 60 prior to using that coating material to coat a sample. With sputtering shield 100 in a shielding position 101, sample 4 may be covered while the ion beam works on coating material 60 while coating donor translation stage 50 is in the sputtering position 51. Once the coating material has been cleaned sufficiently, sputtering shield 100 may be moved to non-shielding position 103. Thereafter, sample 4 may receive coating portion 64 of sputtered coating material 62. Consistent with the foregoing description FIG. 4A illustrates sputtering shield 100 in shielding position 101, while FIG. 4B shows sputtering shield 100 in non-shielding position 103.

Figure 5A:
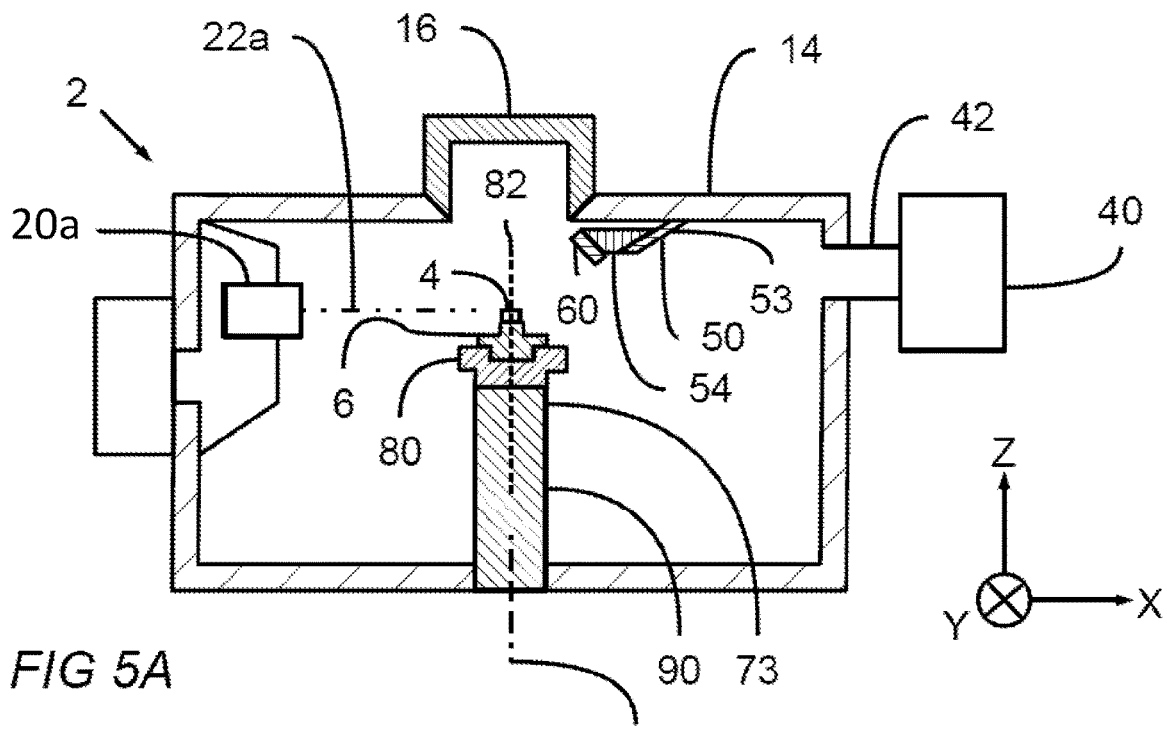
FIG. 5A shows a schematic cross sectional view of an ion beam sample preparation and coating apparatus according to the present disclosure in which the apparatus has a rotating sample retention stage. The figure shows rotating sample retention stage in a milling position and coating donor translation stage in a quiescent position.
Figure 5B:
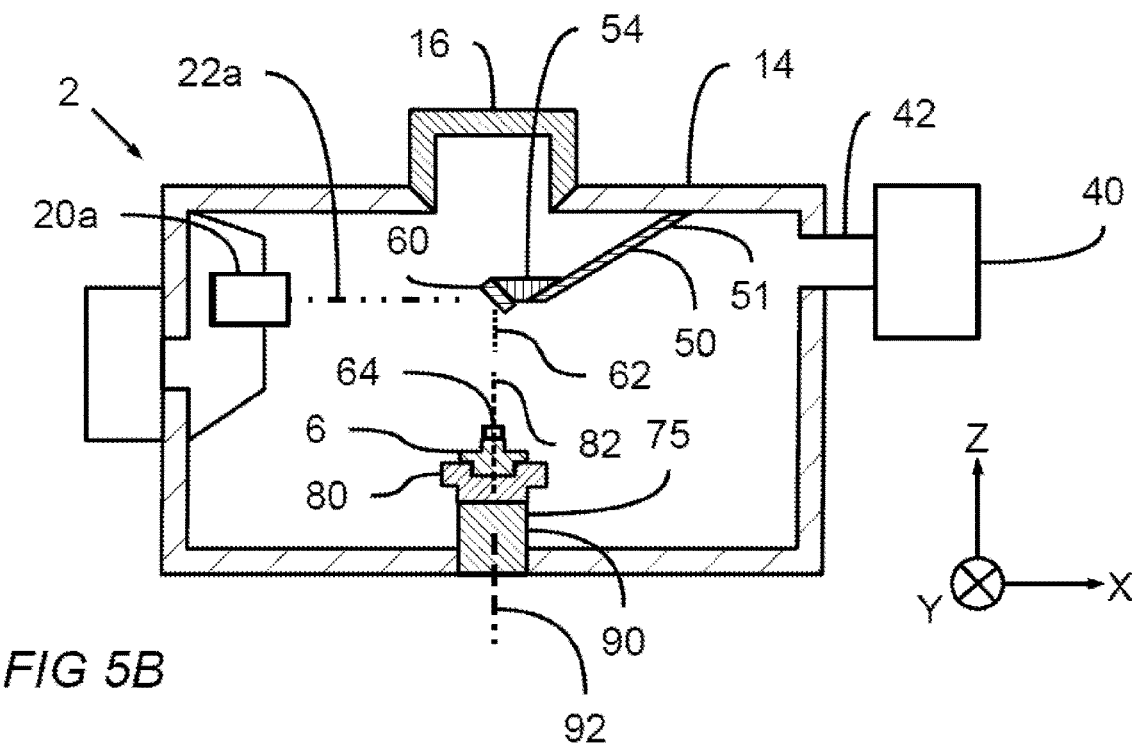
FIG. 5B shows a schematic cross sectional view of the same apparatus as FIG. 5A. The figure shows rotating sample retention stage in a coating position and coating donor translation stage in a sputtering position.

Turning to FIG. 5A and FIG. 5B, shown is an embodiment of an ion beam sample preparation and coating apparatus 2 for preparing a sample 4 and coating the sample with a coating material 60 according to an embodiment of the present disclosure comprising: a first ion beam irradiating means 20a disposed in a vacuum chamber 14 directing an ion beam along a first central ion beam axis 22a; a coating donor translation stage 50 which is operable to move between a sputtering position 51 and a quiescent position 53. The coating donor translation stage 50 is coupled to a coating donor holder 54, with coating donor holder 54 configured to hold coating material 60. Sputtering position 51 is characterized in that the coating donor holder 54 positions a portion of coating material 60 in the path of first central ion beam axis 22a, the interaction of the ion beam with coating material 60 creating a sputtered coating material in vacuum chamber 14. Quiescent position 53 is characterized in that coating donor holder 54 positions none of coating material 60 in the path of first central ion beam axis 22a. Also disposed in the vacuum chamber is a rotating sample retention stage 80 configured to releasably retain a sample holder 6 which holds sample 4 in a predetermined position and orientation with respect to first central ion beam axis 22a, rotating sample retention stage 80 having: a lifting drive 90; a lifting axis 92; and a rotation axis 82; lifting drive 90 operable to move rotating sample retention stage 80 along lifting axis 92 between a milling position 73 and a coating position 75; the milling position 73 characterized in that rotating sample retention stage 80 is positioned to hold at least a portion of sample 4 in the path of first central ion beam axis 22a, and the coating position 75 characterized in that rotating sample retention stage 80 is positioned so that none of sample 4 intersects first central ion beam axis 22a and further characterized in that at least a portion of sample 4 is positioned to receive a coating portion 64 of sputtered coating material 62 present in the vacuum chamber; rotating sample retention stage 80 is operable to rotate sample 4 about rotation axis 82 for at least a portion of one rotation. FIG. 5A shows rotating sample retention stage 80 in milling position 73 and coating donor translation stage 50 in quiescent position 53. FIG. 5B shows rotating sample retention stage 80 in coating position 75 and coating donor translation stage 50 in sputtering position 51.

During preparation and coating of the sample, rotating sample retention stage 80 may control the rotation about rotation axis 82. Rotating sample retention stage 80 may be configured to rotate through a full 360° of rotation or back and forth between two distinct angular positions. In addition, rotating sample retention stage 80 may be configured for either continuous or intermittent rotation. Rotating sample retention stage 80 may be further configured to measure the rotational position of the stage and that measurement or sequence of measurements may be used to control position, speed, or acceleration of rotating sample retention stage 80. It is noted that rotation may be used during sample preparation, during coating, during both preparation and coating, or not at all.

Also, during preparation of the sample, an ion beam intensity control means may vary the intensity of the ion beam so that at least two different beam intensities may be used during sample preparation, sample coating, or any combination of preparation and coating. In addition, during preparation of the sample, an ion beam tilt drive may vary the tilt angle of the ion beam so that at least two different tilt angles may be used during sample preparation. After the sample has been prepared and coated in the ion beam, the chamber cover may be removed; then the sample holder may be removed and the prepared and coated sample may be observed in a microscope.

It may be advantageous to be able to transfer a sample to or from the sample preparation and coating apparatus under environmentally controlled conditions such as vacuum or inert atmosphere. Turning now to FIG. 6A, FIG. 6B, FIG. 6C, and FIG. 6D, shown is a vacuum transfer device 120 for transferring a sample to and from an ion beam sample preparation and coating apparatus while maintaining a controlled environment around the sample. The vacuum transfer device 120 of FIGS. 6A-6D comprises: an outer vacuum bell 122, an inner vacuum bell 124, a sample holder 6, and a transfer means 130. Outer vacuum bell 122 is configured to removably mount to loading chamber 18 thereby creating a vacuum-tight seal; inner vacuum bell 124 is sized to fit inside of outer vacuum bell 122 and is configured to create a removable vacuum-tight seal against sample holder 6 thereby creating a substantially vacuum-tight transfer chamber 126 sized to isolate both the sample and a portion of the sample holder from the environment. Transfer means 130 is operable to complete, in conjunction with an ion beam sample preparation and coating apparatus, both a loading sequence 200 and an unloading sequence 250 while outer vacuum bell 122 is sealed against loading chamber 18 and maintains a vacuum-tight seal with the vacuum chamber. When sample 4 has been retained by sample holder 6, and sample holder 6 has been engaged with inner vacuum bell 124 to create a removable and substantially vacuum-tight seal, the sample may be transported in the vacuum transfer device 120.

FIG. 7A, FIG. 7B, FIG. 7C, and FIG. 7D show a system for ion beam sample preparation and coating comprising a vacuum transfer device consistent with the foregoing descriptions of drawings FIGS. 6A-6D, and an ion beam sample preparation and coating apparatus. The embodiments of FIGS. 7A-7D are similar to the embodiments of FIGS. 1A-1B, 3A-3B, and 5A-5B, additionally having: gate valve 110 disposed in the vacuum chamber 14 and operable to move between gate-open position 111 and gate-closed position 113; gate-closed position 113 characterized in that a substantially vacuum-tight loading chamber 18 is created between the closed gate valve and a portion of vacuum chamber 14; gate-closed position 113 further characterized in that a substantially vacuum-tight seal is created between loading chamber 18 and the portion of the vacuum chamber in which first ion beam irradiating means 22a is disposed; gate-open position 111 characterized in that sample holder 6 can pass through gate valve 110; in addition, vacuum pumping means 40 is coupled to a first vacuum manifold 42a and is configured to selectively evacuate and maintain vacuum pressure in loading chamber 18, vacuum pumping means 40 also coupled to a second vacuum manifold 42b and is configured to selectively evacuate and maintain vacuum pressure in vacuum chamber 14.

In can be appreciated that having a loading chamber in the apparatus allows certain desirable efficiencies. Instead of venting the entire vacuum chamber when a sample enters or exits the apparatus, the lifting drive may be operated to raise the sample retention stage into the loading position thereby creating the loading chamber. In preferred embodiments, the volume of the loading chamber is much smaller that the volume of the vacuum chamber. Vacuum conditions are maintained in the remainder of the vacuum chamber when the sample retention stage is in the loading position. Venting and evacuating the small volume of the loading chamber takes much less time than it does to vent and evacuate the entire chamber. When the loading chamber has been evacuated to pressures appropriate for ion beam milling, the lifting drive may be operated to move the sample into the milling or coating positions, and the sample may again be prepared in the ion beam or coated by the action of the ion beam on the coating material.

Figure 7A:
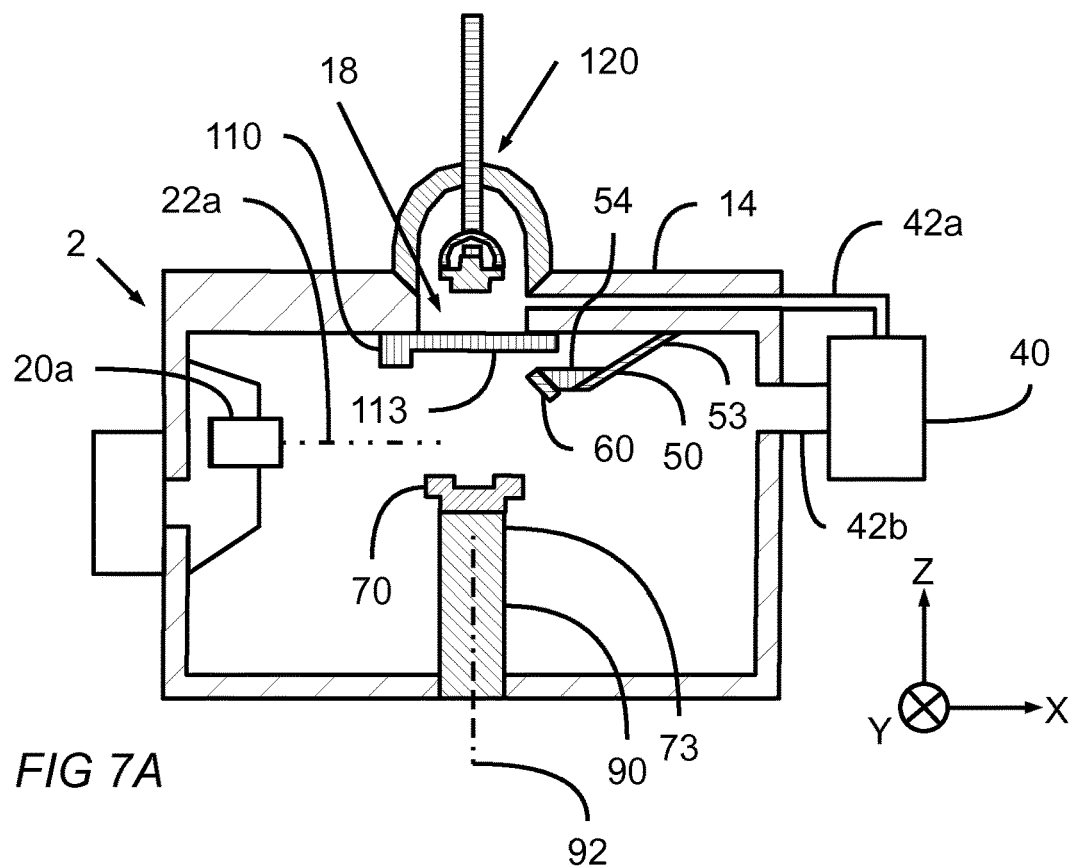
FIG. 7A, FIG. 7B, FIG. 7C, and FIG. 7D show schematic cross sectional views of an apparatus according to the present disclosure having a gate valve and making use of the vacuum transfer device of FIG. 6A-6D to both load samples into the apparatus and unload samples out of the apparatus.

In FIG. 7A, vacuum transfer device 120, which has been previously loaded with a sample, is engaged with vacuum chamber 14. Gate valve 110 is in gate-closed position 113 with the vacuum transfer device 120 in place on the vacuum chamber 14, thereby creating a substantially vacuum-tight loading chamber 18. Vacuum pumping means 40 may operate through first vacuum manifold 42a to evacuate loading chamber 18 to appropriate vacuum levels.

Figure 7B:
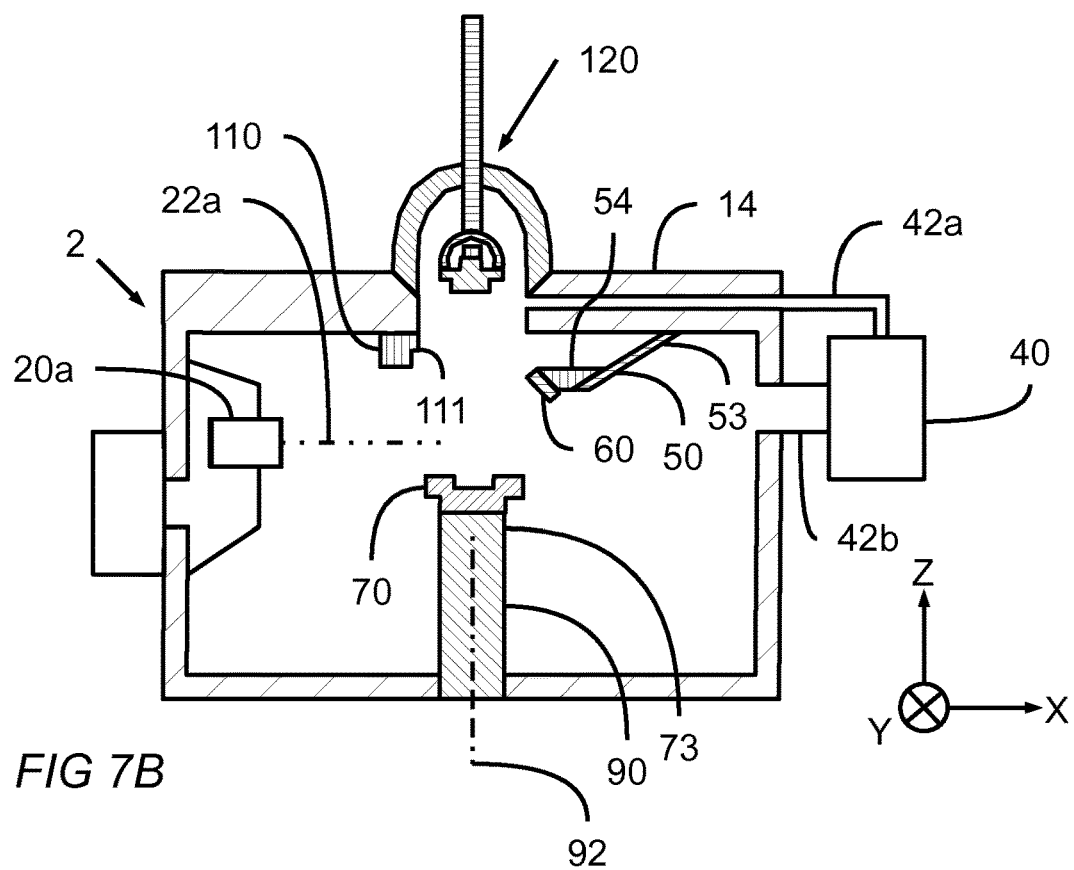

FIG. 7B shows the system of FIG. 7A with gate valve 110 in gate-open position 111. When in the gate-open position 111, gate valve 110 is configured to allow transfer chamber 126 of FIG. 6B to pass through the gate valve and into the portion of vacuum chamber 14 in which ion beam irradiating means 20a is disposed.

Figure 7C:
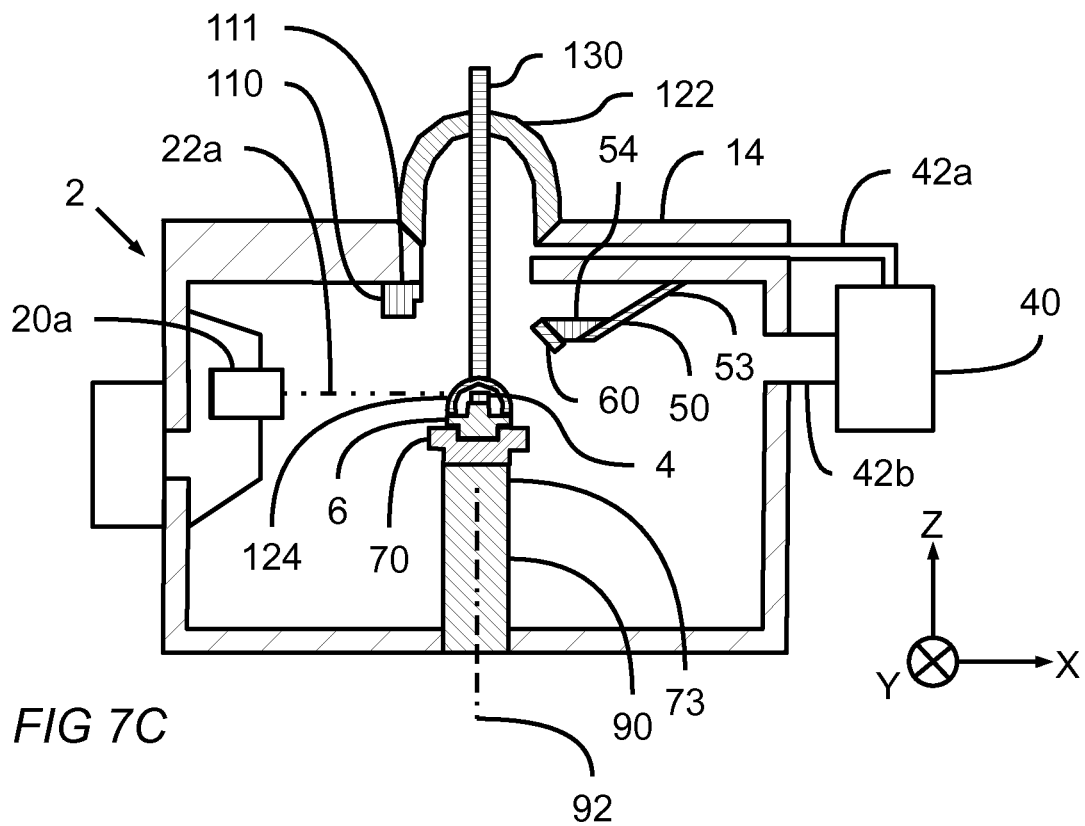

FIG. 7C shows the system of FIG. 7B in which the transfer means 130 may be used to: move inner vacuum bell 124, sample holder 6, and sample 4 towards sample retention stage 70; urge sample holder 6 to engage with sample retention stage 70; urge inner vacuum bell to disengage from sample holder 6; and move inner vacuum bell 124 towards outer vacuum bell 122.

Figure 7D:
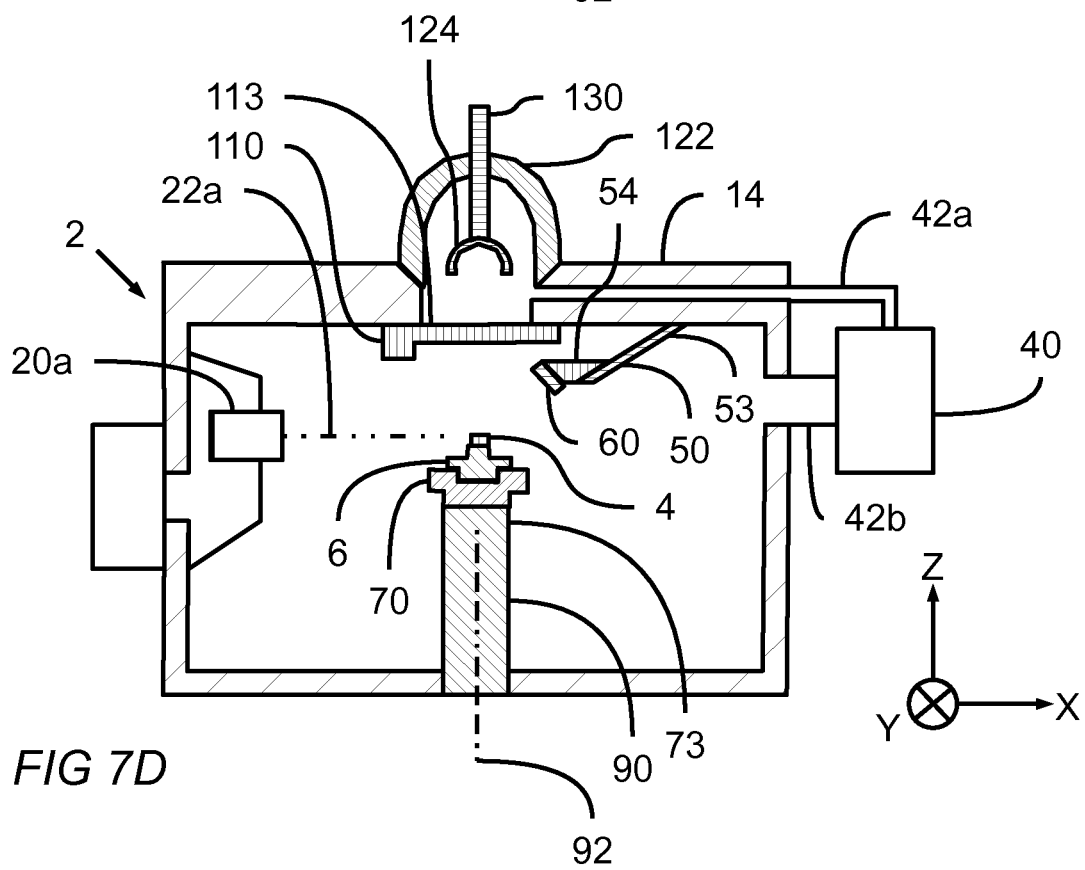

FIG. 7D shows the system of FIG. 7C in which the gate valve 110 has been operated into gate-closed position 113 thereby creating a substantially vacuum-tight seal between gate valve 110 and the portion of vacuum chamber 14 in which ion beam irradiating means 20a is disposed. The system of FIG. 7D may now be operated to prepare a sample and coat a sample in the manner previously described according to the apparatus of FIG. A and FIG. 1B.

Figure 8A:
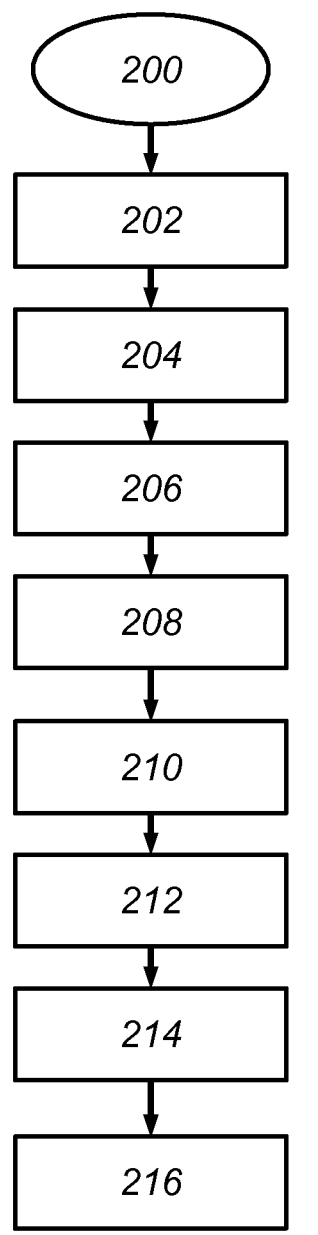
FIG. 8A shows a flow diagram of process steps involved in a loading sequence using the system of FIGS. 6A-6D, and FIGS. 7A-7D.

FIG. 8A shows, with reference to the system of FIG. 7A, FIG. 7B, FIG. 7C, and FIG. 7D, loading sequence 200 comprising the steps of: creating a substantially vacuum-tight loading chamber between the vacuum transfer device and the vacuum chamber 202; at least partially evacuating the loading chamber 204; opening the gate valve between the loading chamber and the portion of the vacuum chamber in which the sample retention stage is disposed 206; moving the inner vacuum bell from the loading chamber towards sample retention stage 208; engaging sample holder with sample retention stage 210; disengaging inner vacuum bell from the sample holder 212; moving the inner vacuum bell back to the loading chamber 214; closing the gate valve between the loading chamber and the portion of the vacuum chamber in which the sample retention stage is disposed 216.

Figure 8B:
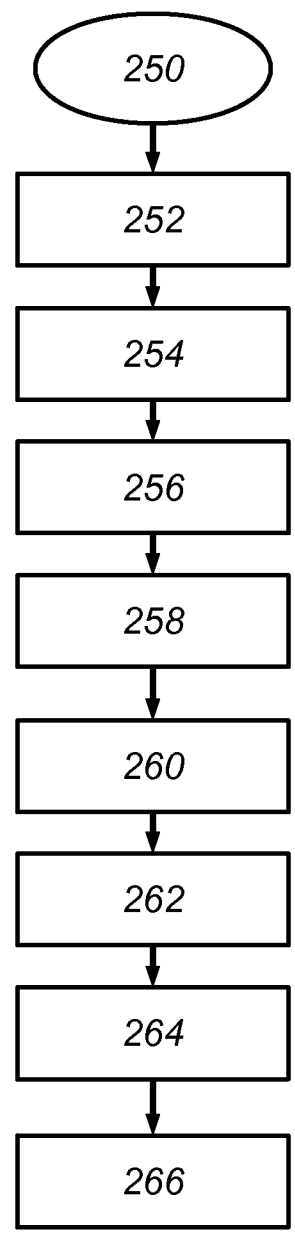
FIG. 8B shows a flow diagram of process steps involved in an unloading sequence using the system of FIGS. 6A-6D, and FIGS. 7A-7D.

FIG. 8B shows, with reference to the system of FIG. 7A, FIG. 7B, FIG. 7C, and FIG. 7D, unloading sequence 250 comprising the steps of: opening the gate valve between the loading chamber and the portion of the vacuum chamber in which the sample retention stage is disposed 252; moving inner vacuum bell from the loading chamber towards sample retention stage 254; engaging sample holder with inner vacuum bell 256; creating a substantially vacuum-tight seal between sample holder and inner vacuum bell 258; disengaging sample holder from sample retention stage 260; moving the inner vacuum bell, sample holder, and sample back toward outer vacuum bell 262; closing gate valve thereby creating substantially vacuum-tight loading chamber 264; returning loading chamber to substantially ambient pressure 266.

FIG. 9A, FIG. 9B, FIG. 9C, and FIG. 9D show an ion beam sample preparing and coating apparatus 2 for preparing a sample 4 and coating the sample with a coating material 60 according to another embodiment of the present disclosure. The embodiment of FIGS. 9A, 9B, 9C, and 9D is shown comprising: first ion beam irradiating means 20a disposed in vacuum chamber 14 directing a first ion beam along first central ion beam axis 22a; a coating donor translation stage 50 operable to move between a sputtering position 51 and a quiescent position 53, the coating donor translation stage 50 coupled to a coating donor holder 54, the coating donor holder 54 configured to hold coating material 60; sputtering position 51 characterized in that coating donor holder 54 positions a portion of coating material 60 in the path of first central ion beam axis 22a where the interaction of the first ion beam with coating material 60 creates a sputtered coating material 62 in vacuum chamber 14; the quiescent position 53 characterized in that coating donor holder 54 positions none of coating material 60 in the path of first central ion beam axis 22a; a sample retention stage 70 configured to releasably retain a sample holder 6 which holds sample 4 in a predetermined position and orientation with respect to first central ion beam axis 22a; the sample retention stage having: a lifting axis 92; and a lifting drive 90; the lifting drive 90 operable to move sample retention stage 70 along lifting axis 92 between: a loading position 71; a milling position 73; and a coating position 75; loading position 71 characterized in that a substantially vacuum-tight loading chamber is created between the sample retention stage 70 and a portion of the vacuum chamber, loading position 71 further characterized in that a substantially vacuum-tight seal is created between the loading chamber and the portion of the vacuum chamber in which the ion beam irradiating means is disposed; milling position 73 characterized in that sample retention stage 70 is positioned to hold at least a portion of sample 4 in the path of first central ion beam axis 22a; coating position 75 characterized in that none of sample 4 intersects first ion beam central axis 22a and further characterized in that at least a portion of the sample is positioned to receive a coating portion 64 of sputtered coating material 62 present in the vacuum chamber. In addition, vacuum pumping means 40 is coupled to a first vacuum manifold 42a and is configured to selectively evacuate and maintain vacuum pressure in loading chamber 18, vacuum pumping means 40 also coupled to a second vacuum manifold 42b and is configured to selectively evacuate and maintain vacuum pressure in vacuum chamber 14.

Figure 9A:
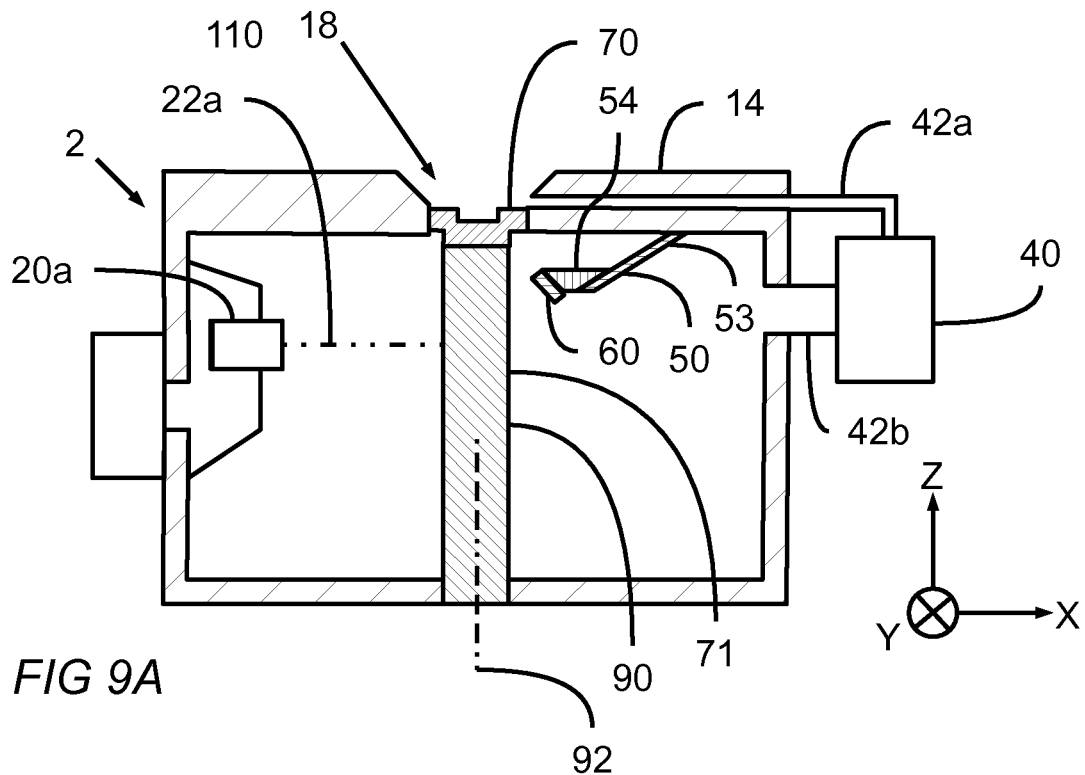
FIG. 9A, FIG. 9B, FIG. 9C, and FIG. 9D show schematic cross sectional views of another apparatus for ion beam sample preparation and coating.
Figure 9B:
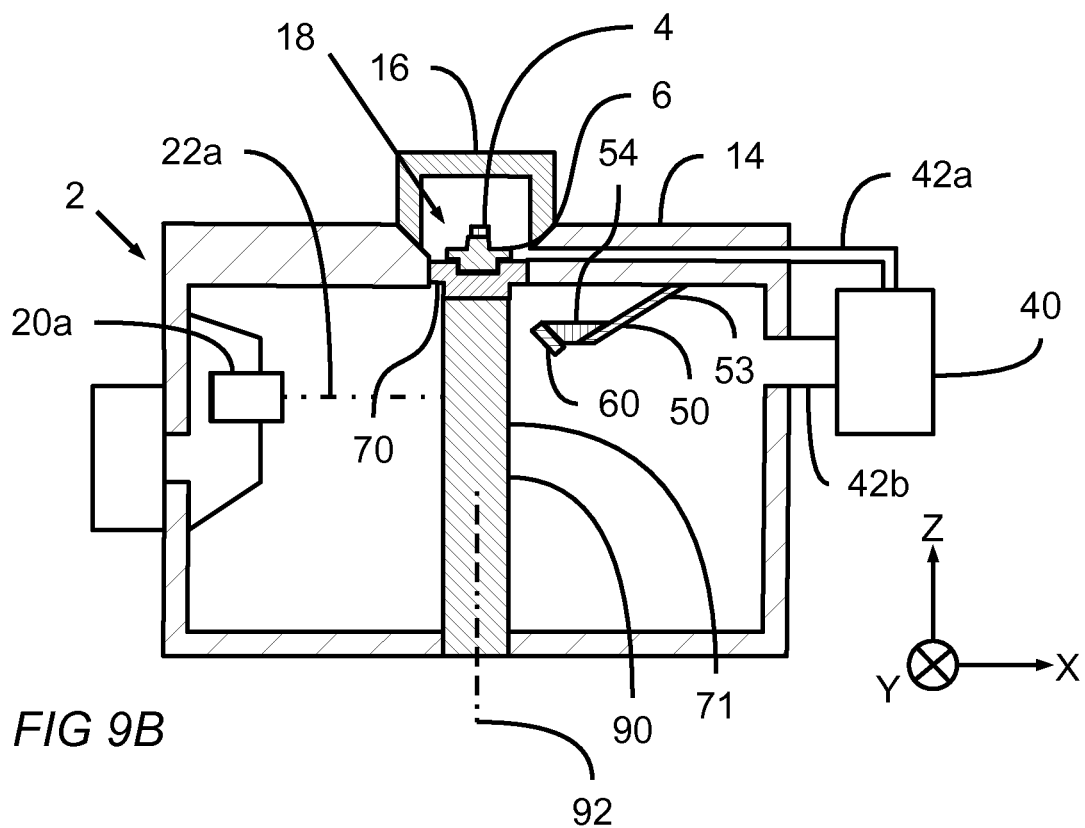
Figure 9C:
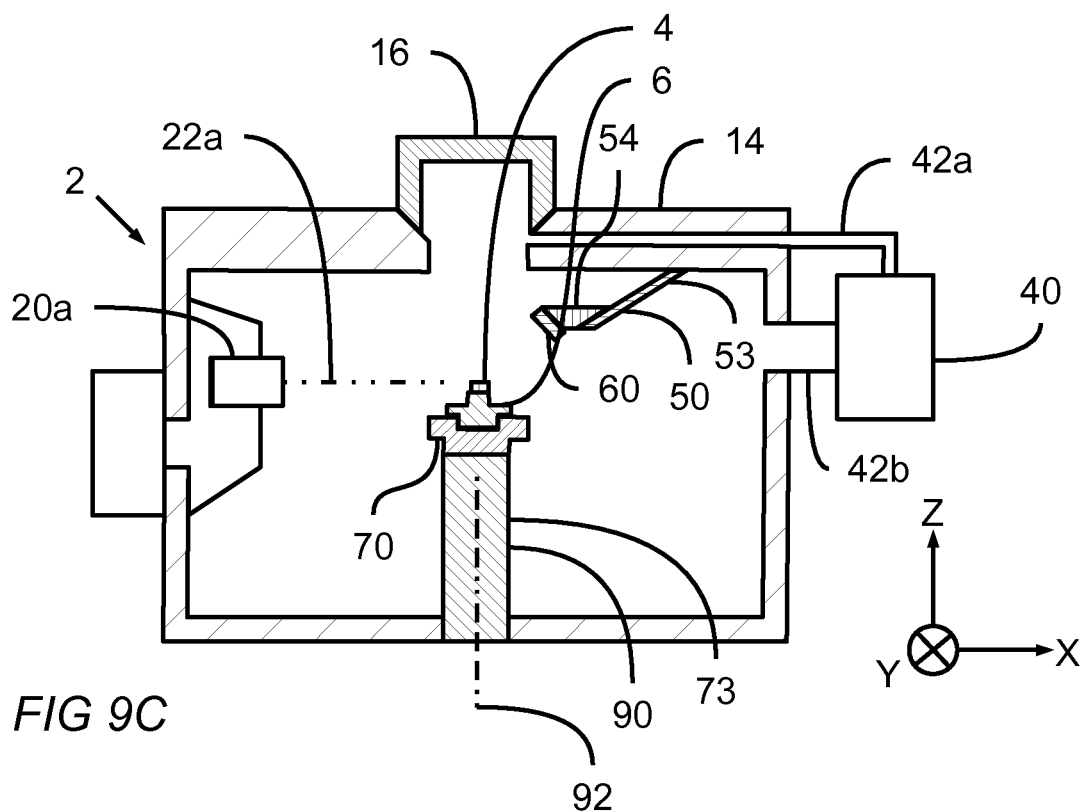
Figure 9D:
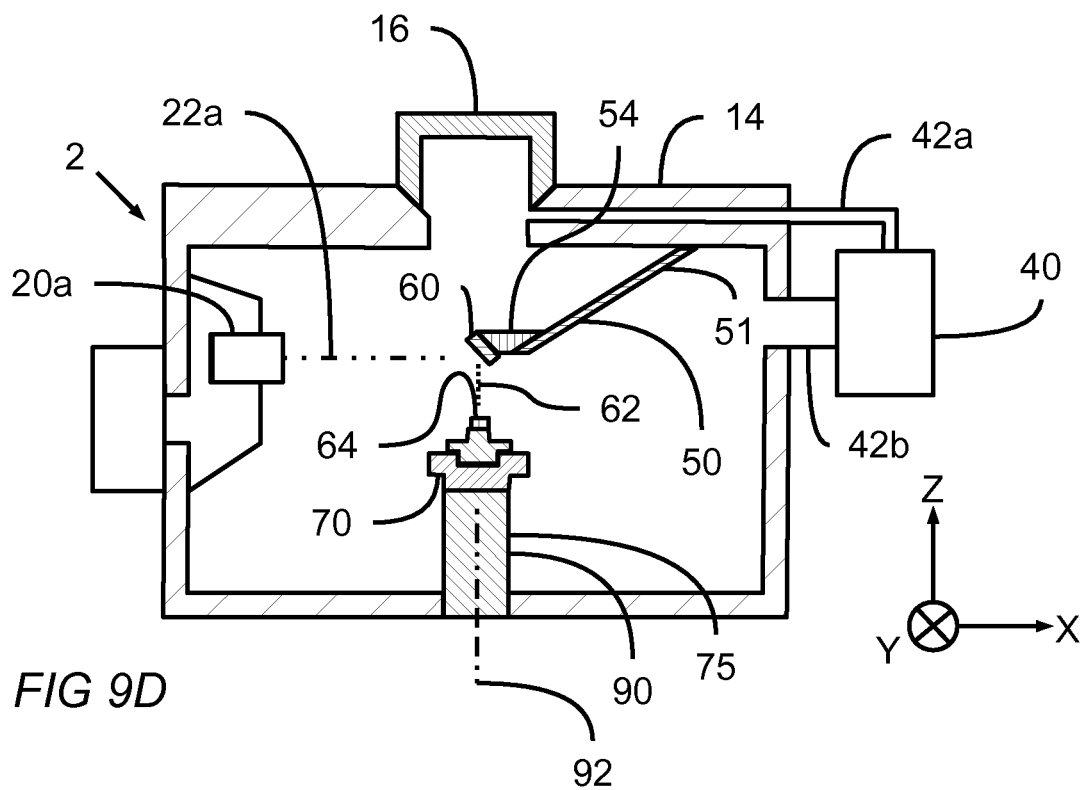

FIG. 9A, FIG. 9B, FIG. 9C, and FIG. 9D illustrate various steps in using apparatus 2 to load, prepare, coat, and unload samples. FIG. 9A shows sample retention stage 70 raised into loading position 71 and ready to receive and engage a sample holder. FIG. 9B shows: sample retention stage 70 retaining sample holder 6 in which is held sample 4; chamber cover 16 is in place to create a substantially vacuum-tight loading chamber; and vacuum pumping means 40 operable through first vacuum manifold 42a to pump loading chamber 18 to suitable pressure level. FIG. 9C shows the apparatus preparing sample 4 in the ion beam. FIG. 9D shows the apparatus coating sample 4 with a coating portion 64 of sputtered coating material 62.

Figure 10A:
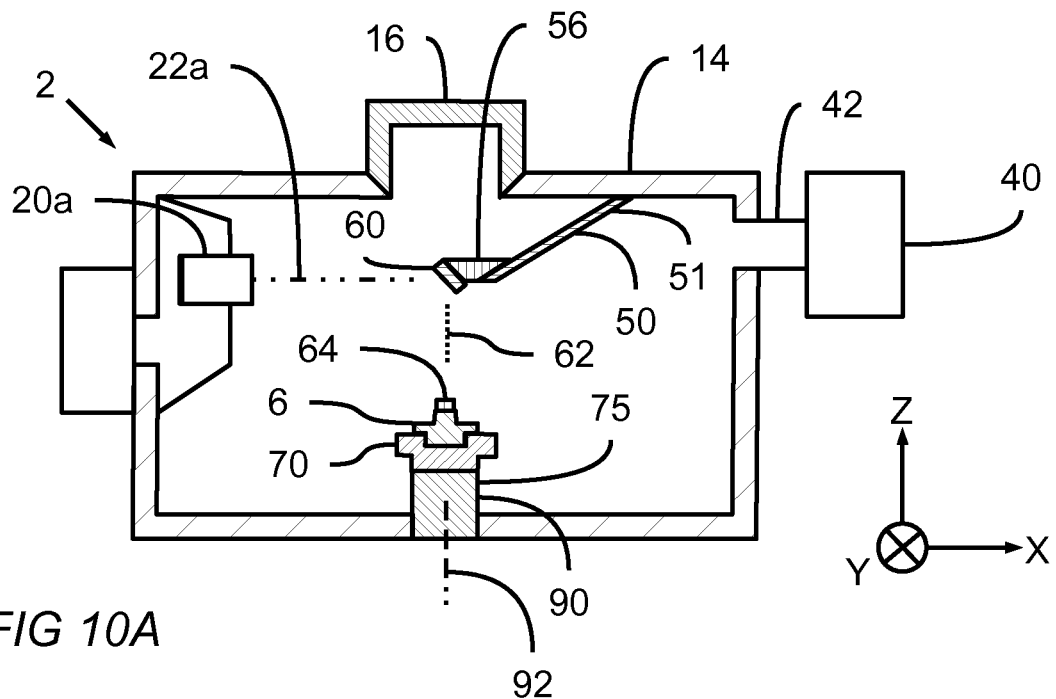
FIG. 10A shows a schematic cross sectional view of an apparatus according to the present disclosure in which the apparatus has a modulating coating donor holder.
Figure 10B:
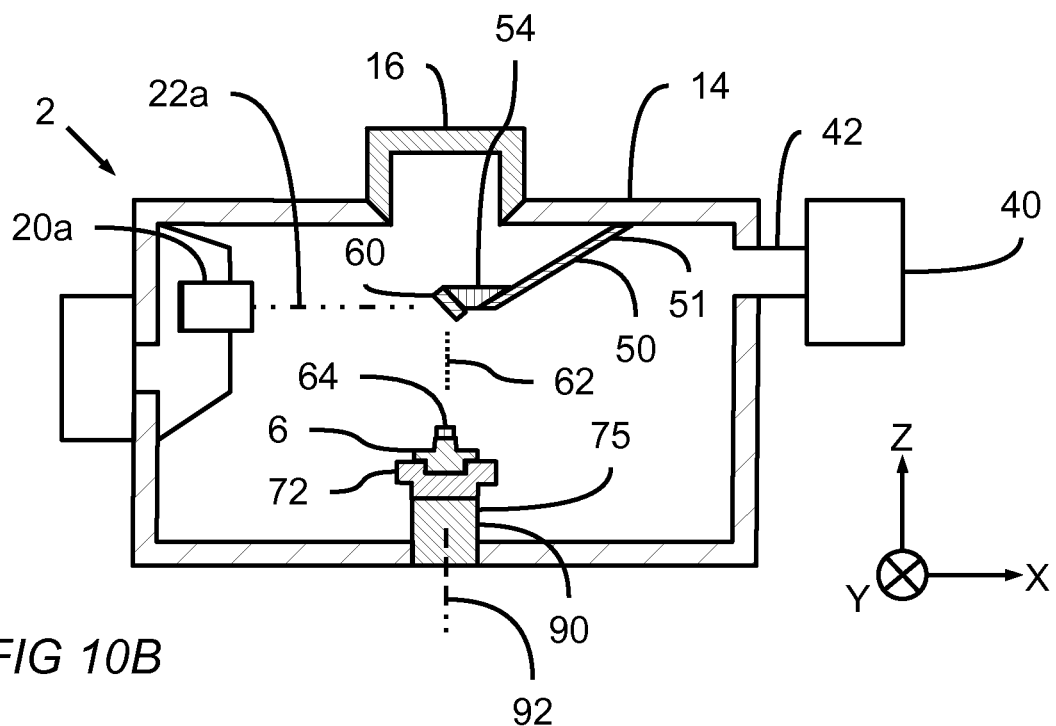
FIG. 10B shows a schematic cross sectional view of an apparatus according to the present disclosure in which the apparatus has a modulating sample retention stage.

Also within the scope of the present disclosure are other embodiments that may allow for improved uniformity of sample coating produced by the coating process. One such improvement is the embodiment of FIG. 10A, similar to FIG. 1B, FIG. 3B, and FIG. 5B, and further characterized in that the coating donor holder is a modulating coating donor holder 56 operable to modulate the position, orientation, or both position and orientation of the coating material when coating donor translation stage 50 is disposed in coating position 51. Another improved embodiment is shown in FIG. 10B, similar to FIG. 1B, FIG. 3B, and FIG. 5B, and further characterized in that the sample retention stage is a modulating sample retention stage 72 operable to modulate the position, orientation, or both position and orientation of sample holder 6 when modulating sample retention stage 72 is in coating position 75. In preferred embodiments according to FIG. 10B, modulating sample retention stage 72 may be operable to modulate the position of sample holder 6 in an X-Y plane that is about perpendicular to lifting axis 92.

Figure 11A:
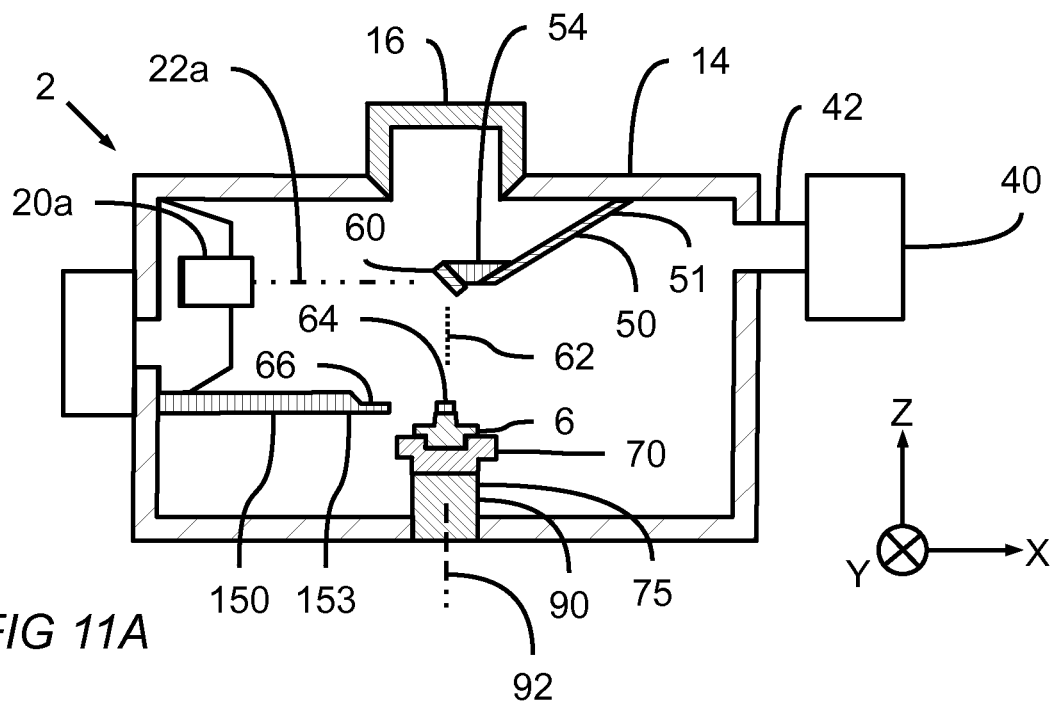
FIG. 11A and FIG. 11B show a schematic cross sectional view of an embodiment that may be used to monitor the thickness of coating accumulated on the sample during the coating process.
Figure 11B:
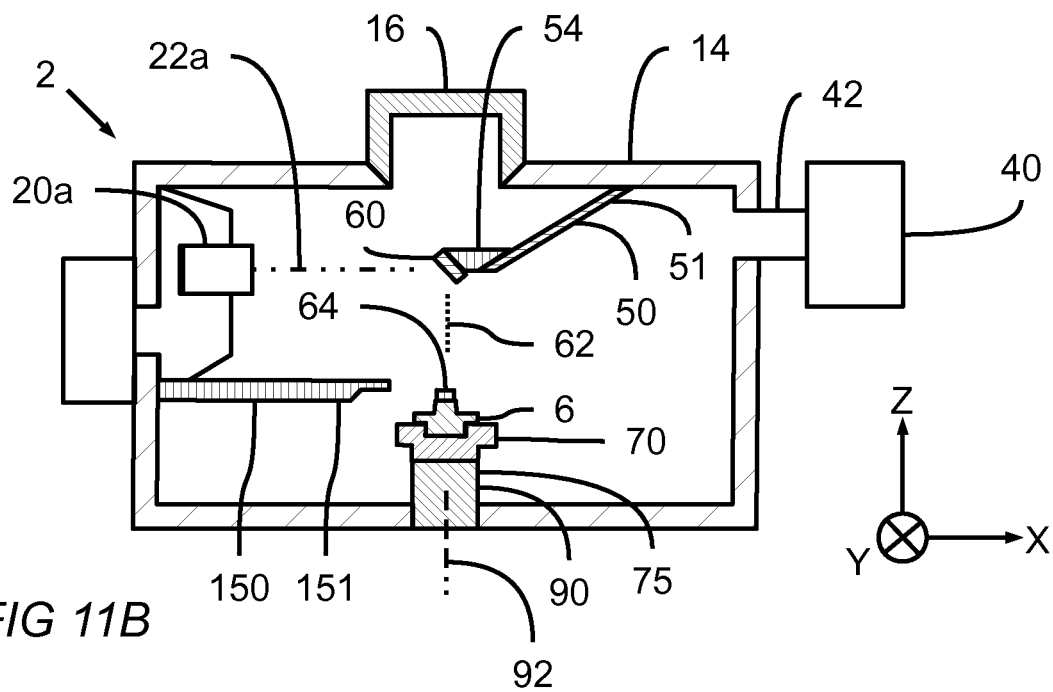

FIG. 11A and FIG. 11B show an embodiment that may be used to monitor the thickness of coating accumulated on the sample during the coating process. Shown is an embodiment in which coating thickness monitor 150 is disposed in vacuum chamber 14 and has both a shielded position 151 and a monitoring position 153; monitoring position 153 characterized in that coating thickness monitor 150 is disposed to receive a monitoring portion 66 of sputtered coating material 62 present in the vacuum chamber, monitoring portion 66 being proportional to coating portion 64 received by sample 4; the shielded position 151 characterized in that coating thickness monitor 150 receives substantially none of the sputtered coating material present in the vacuum chamber.

The coating thickness monitor 150 of FIG. 11A may measure the thickness of a thin film, not only after it has been made, but also while it is still being deposited. In some embodiments the coating thickness monitor may be used to control the final thickness of the coating, the rate at which the coating is deposited, or both. The rate at Which the monitoring portion is received on the coating thickness monitor may not equal the rate at which the coating portion is received on the sample. The ratio of the two rates may be computed and used as a scaling factor to estimate, infer, predict, or otherwise quantify the the accumulated coating thickness or the rate of accumulation on the sample based upon the monitoring portion received on the coating thickness monitor. It is within the scope and spirit of the present disclosure that the coating thickness monitor may provide thickness measurements that are then used to increase, decrease, modulate, stop, or start other operable components of the apparatus to effect changes in: ion beam current of one or more ion beams; ion beam energy of one or more ion beams; rotation of the sample retention stage; modulation of coating donor holder; and tilt angle of one or more ion beams.

Figure 12A:
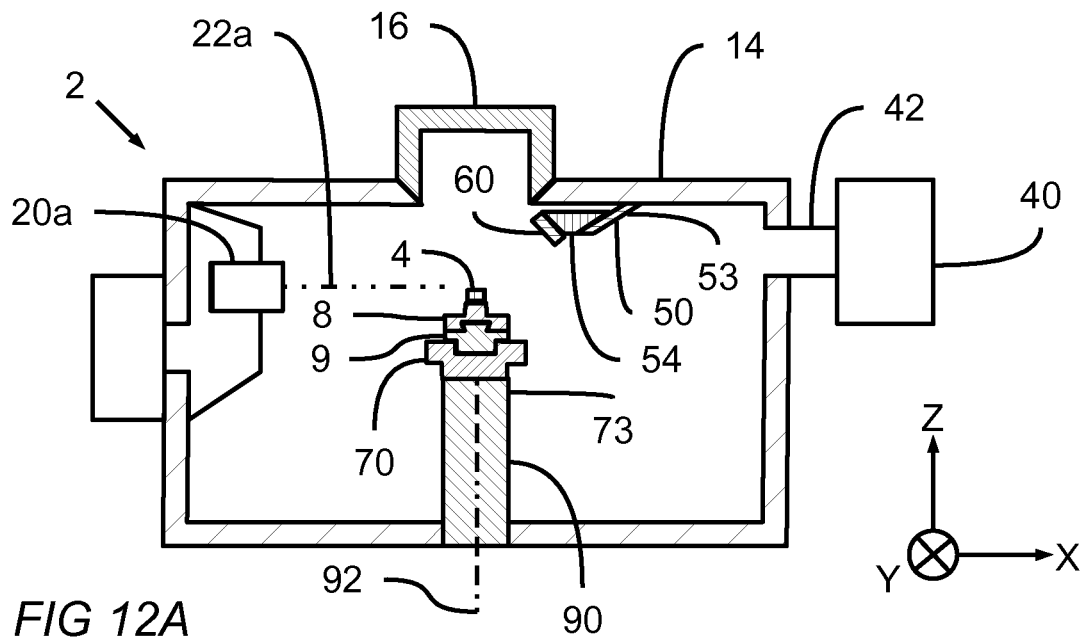
FIG. 12A and FIG. 12B show a schematic cross sectional view of an ion beam sample preparation and coating apparatus according to the present disclosure in which a primary sample holder is coupled to a secondary sample holder with the secondary sample holder being releasable retained by a sample retention stage.
Figure 12B:
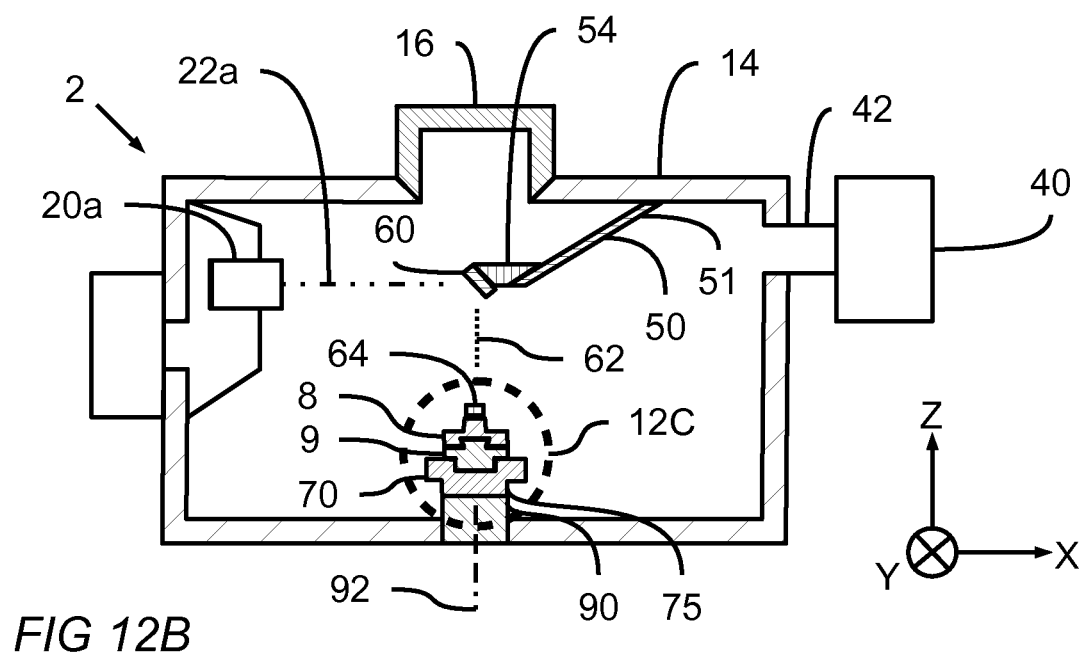

Turning now to FIG. 12A and FIG. 12B, shown is an ion beam apparatus 2 for preparing a sample 4 and coating said sample with a coating material 60 according to an embodiment of the present disclosure comprising: a first ion beam irradiating means 20a disposed in a vacuum chamber 14 directing an ion beam along a first central ion beam axis 22a; a coating donor translation stage 50 operable to move between a sputtering position 51 and a quiescent position 53, the coating donor translation stage coupled to a coating donor holder 54, the coating donor holder configured to hold coating material 60; sputtering position 51 characterized in that coating donor holder 54 positions a portion of the coating material in the path of first central ion beam axis 22a, the interaction of the ion beam with the coating material creating a sputtered coating material 62 in vacuum chamber 14; quiescent position 53 characterized in that coating donor holder 54 positions none of coating material 60 in the path of first central ion beam axis 22a; a sample retention stage 70 configured to releasably retain a secondary sample holder 9, sample retention stage 70 having a lifting axis 92 and a lifting drive 90; secondary sample holder 9 configured to releasably retain a primary sample holder 8 in a predetermined position and orientation; primary sample holder 8 configured to retain sample 4 in a predetermined position and orientation; primary sample holder 8 further characterized in that it can be released from secondary sample holder 9 without releasing secondary sample holder 9 from sample retention stage 70; lifting drive 90 being operable to move sample retention stage 70 along lifting axis 92 between a milling position 73 and a coating position 75; milling position 73 characterized in that the sample retention stage is positioned to hold at least a portion of sample 4 in the path of first central ion beam axis 22a; coating position 75 characterized in that the sample retention stage is positioned so that none of said sample intersects first central ion beam axis 22a and further characterized in that at least a portion of sample 4 is positioned to receive a coating portion 64 of sputtered coating material 62 present in said vacuum chamber. FIG. 12A shows the sample retention stage in milling position 73 while FIG. 12B shows the sample retention stage in coating position 75.

The operation of the apparatus of FIGS. 12A and 12B may proceed with reference to the following steps: outside of the vacuum chamber a sample may be mounted to a primary sample holder with a predetermined position and orientation; the primary sample holder may then be releasable coupled to a secondary sample holder; with the chamber cover removed, the sample and primary sample holder and secondary sample holder combination may be retained in the sample retention stage; the chamber cover may then be replaced; the vacuum pump means may then be operated to evacuate the vacuum chamber through the pumping manifold, thereby obtaining vacuum levels appropriate for ion beam milling; the ion beam irradiating means may then be operated to prepare the sample; the sample may then be lowered to the coating position; the coating donor translation stage may be operated to move the stage into the coating position; the sample may then be coated with a coating portion of the sputtered coating material; the primary sample holder may then be released from the secondary sample holder so that the sample and primary sample holder combination may be transferred out of the vacuum chamber.

FIG. 12C shows an enlarged view of a portion of the apparatus of FIG. 12B in which primary sample holder 8 is releasably retained by secondary sample holder 9 and secondary sample holder 9 is releasably retained by sample retention stage 70. The embodiment of FIG. 12C shows a preferred embodiment in which primary sample holder 8 may be released and move away from secondary sample holder 9 along an axis that is different from the lifting axis along which the sample retention stage moves. In FIG. 12A-FIG. 12B the lifting axis is shown as moving along the Z axis. FIG. 12B in conjunction with enlarged view of FIG. 12C show that the primary sample holder may be released and move away from the secondary sample holder along the Y axis. Thus the primary sample holder and sample combination may be transferred to other equipment while the sample remains in vacuum or otherwise controlled atmosphere.

As shown in FIG. 12D and FIG. 12E, a transfer port 140 may be built into the apparatus of FIG. 12A-FIG. 12C to facilitate the transfer of sample 6 and primary sample holder 8 combination out of the apparatus and into another apparatus for observation or further sample processing. Transfer port 140 may have both a port-open position 143 and a port-closed position 141, in which port-open position 143 allows the transfer of sample 6 and primary sample holder 8 combination into and out of the apparatus 2, and port-closed position 141 is substantially vacuum-tight. With the aid of a transfer arm, the sample and primary sample holder combination may be released from secondary sample holder 9 and transferred through the transfer port when in port-open position.

In consideration of further embodiments of the present disclosure, it may be advantageous to be able to transfer a sample to or from the sample preparation and coating apparatus under environmentally controlled conditions such as vacuum or inert atmosphere. Turning now to FIGS. 13A-13F, shown is an embodiment of a vacuum transfer device 120 for transferring a sample to and from an ion beam sample preparation and coating apparatus while maintaining a controlled environment around the sample. The vacuum transfer device 120 of FIGS. 13A-13F comprises: an outer vacuum bell 122 coupled to a gate valve 110, and an inner gripper 128 coupled to a transfer means 130. In the figures, both sample 4 and sample holder 6 are shown for better understanding of how the vacuum transfer device works. Gate valve 110 has both a gate-closed position 113 and a gate-open position 111. Gate-closed position is characterized in that a substantially vacuum-tight transfer chamber 126 is created between gate valve 110 and an interior portion of outer vacuum bell 122. Gate-open position 111 is characterized in that inner gripper 128 may pass through gate valve 110 while sample holder 6 is retained by inner gripper 128. Inner gripper 128 is sized to fit inside of outer vacuum bell 122 and is configured to releasably retain sample holder 6. Transfer chamber 126 is configured to isolate sample holder 6 and mounted sample 4 from the environment when gate valve 110 is in gate-closed position 113. Transfer means 130 is operable to complete, in conjunction with an ion beam sample preparation and coating apparatus, both a loading sequence 300 and an unloading sequence 350 while outer vacuum bell 122 is sealed against loading chamber 18 and maintains a vacuum-tight seal with the vacuum chamber. When sample 4 has been retained by sample holder 6, and sample holder 6 has been retained by inner gripper 128, transfer means 130 may be operated to move inner gripper 128 and retained sample holder 6 to a position within outer vacuum bell 122 that permits gate valve 110 to obtain gate-closed position 113. A substantially vacuum-tight transfer chamber 126 is thereby created allowing the sample to be transported within a controlled environment.

FIG. 14A, FIG. 14B, FIG. 14C, FIG. 14D, and FIG. 14E show a system for ion beam sample preparation and coating comprising a vacuum transfer device consistent with the foregoing descriptions of drawings FIGS. 13A-13F, and an ion beam sample preparation and coating apparatus. The embodiments of FIGS. 14A-14E are similar to the embodiments of FIGS. 1A-1B, 3A-3B, and 5A-5B, additionally having: first gate valve 110a disposed in the vacuum chamber 14 and operable to move between first gate-open position 111a and first gate-closed position 113a; first gate-closed position 113a characterized in that a substantially vacuum-tight loading chamber 18 is created between the closed first gate valve 110a and a portion of vacuum chamber 14; first gate-closed position 113a further characterized in that a substantially vacuum-tight seal is created between loading chamber 18 and the portion of the vacuum chamber in which first ion beam irradiating means 22a is disposed; first gate-open position 111a characterized in that sample holder 6 can pass through first gate valve 110a; in addition, vacuum pumping means 40 is coupled to a first vacuum manifold 42a and is configured to selectively evacuate and maintain vacuum pressure in loading chamber 18, vacuum pumping means 40 also coupled to a second vacuum manifold 42b and is configured to selectively evacuate and maintain vacuum pressure in vacuum chamber 14.

Figure 14A:
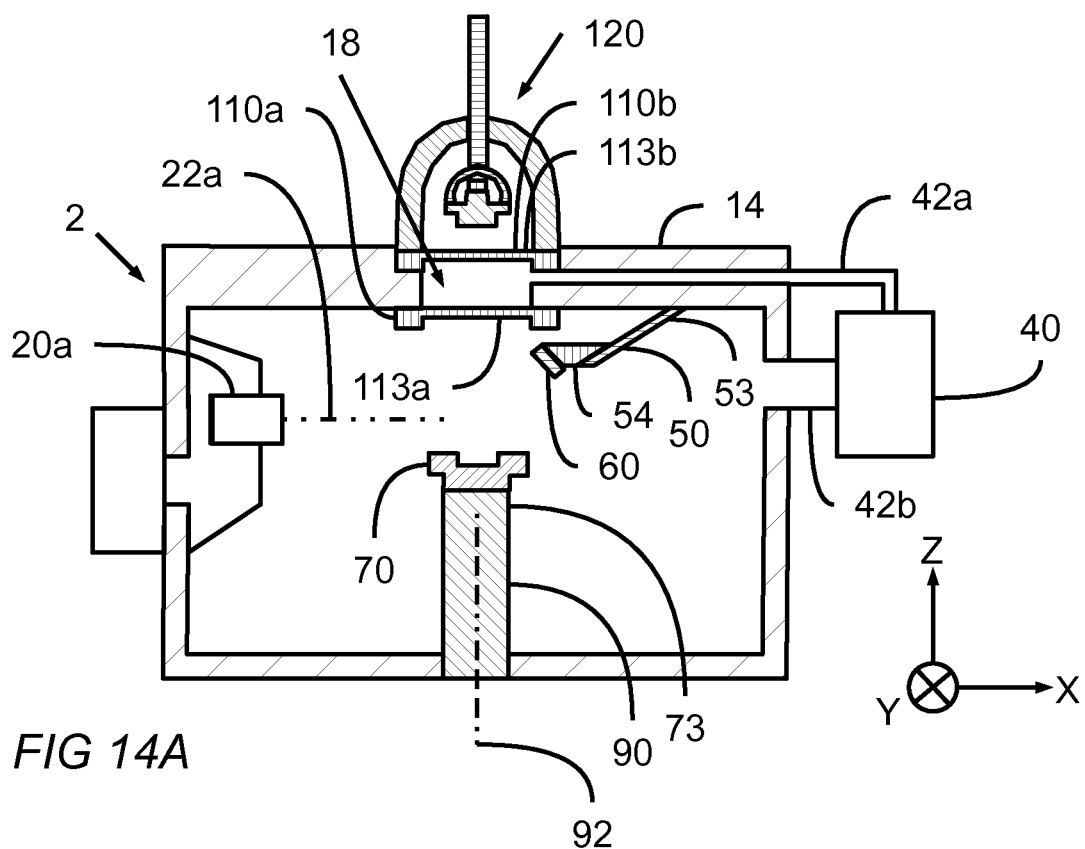
FIG. 14A, FIG. 14B, FIG. 14C, FIG. 14D, and FIG. 14E show schematic cross sectional views of an apparatus according to the present disclosure having a gate valve and making use of the vacuum transfer device of FIG. 13A-13F to both load samples into the apparatus and unload samples out of the apparatus.

In FIG. 14A, vacuum transfer device 120, which has been previously loaded with a sample, is engaged with vacuum chamber 14. First gate valve 110a is in first gate-closed position 113a with the vacuum transfer device 120 in place on the vacuum chamber 14, thereby creating a substantially vacuum-tight loading chamber 18. Vacuum pumping means 40 may operate through first vacuum manifold 42a to evacuate loading chamber 18 to appropriate vacuum levels. Second gate valve 110b is in second gate-closed position 113b thereby maintaining the sample in a controlled environment while loading chamber 18 is pumped to appropriate vacuum level.

Figure 14B:
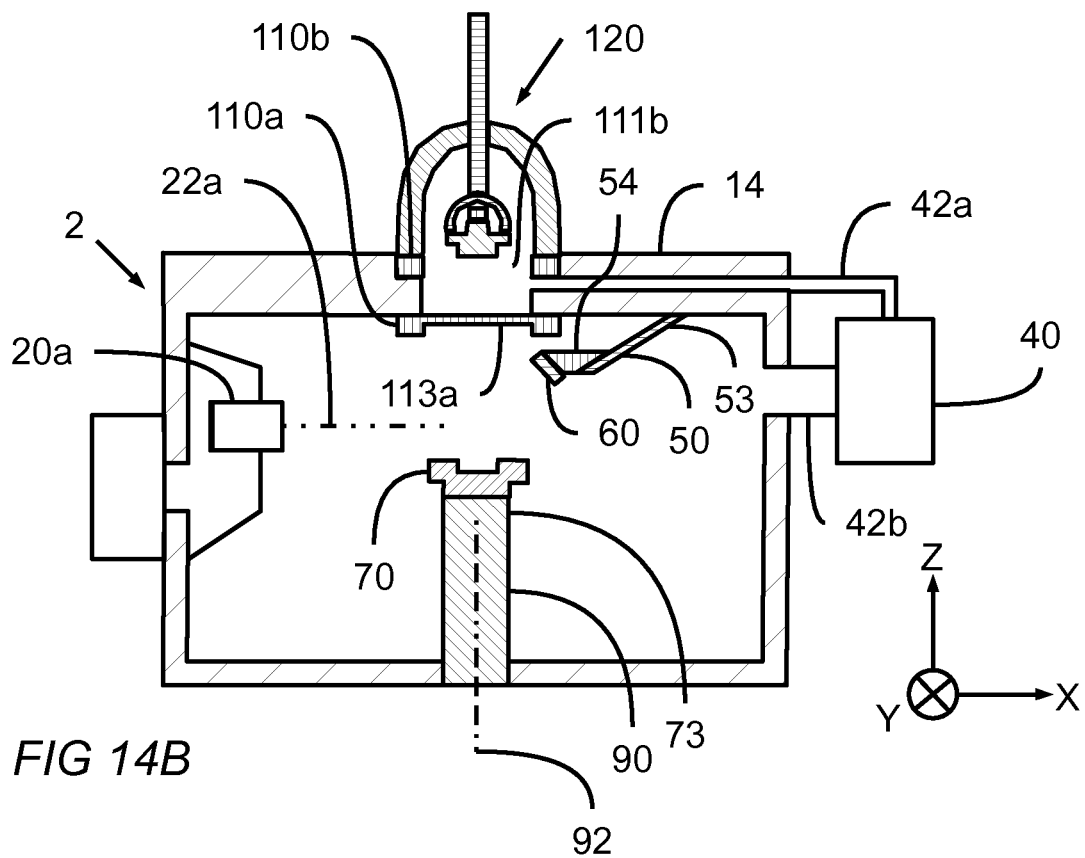
Figure 14C:
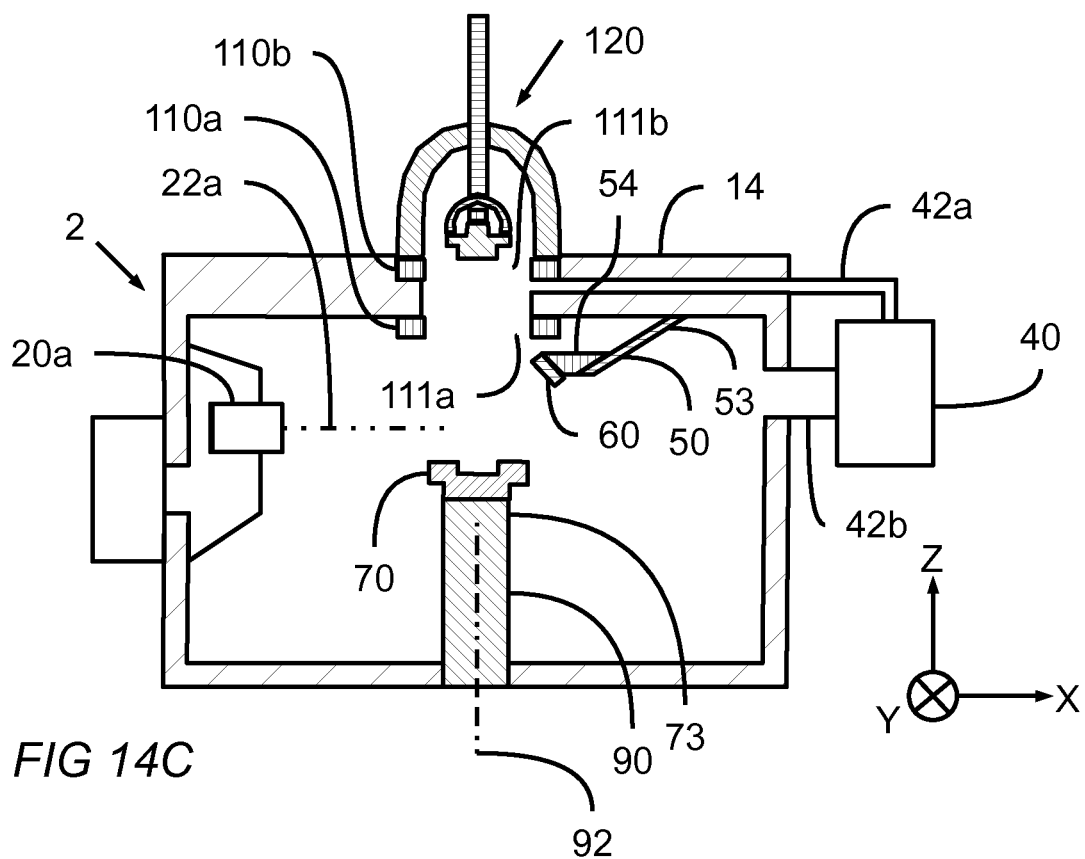

FIG. 14B shows the system of FIG. 14A with second gate valve 110b in second gate-open position 111b. When in second gate-open position 111b, second gate valve 110b is configured to allow vacuum pumping means 40 to evacuate and maintain pressure in the vacuum transfer device 120. FIG. 14C shows the system of FIG. 14B with first gate valve 110a in first gate-open position. When gates valves 110a and 110b are both in gate-open position inner gripper 128 may pass through both gate valves and into the portion of vacuum chamber 14 in which ion beam irradiating means 20a is disposed.

Figure 14D:
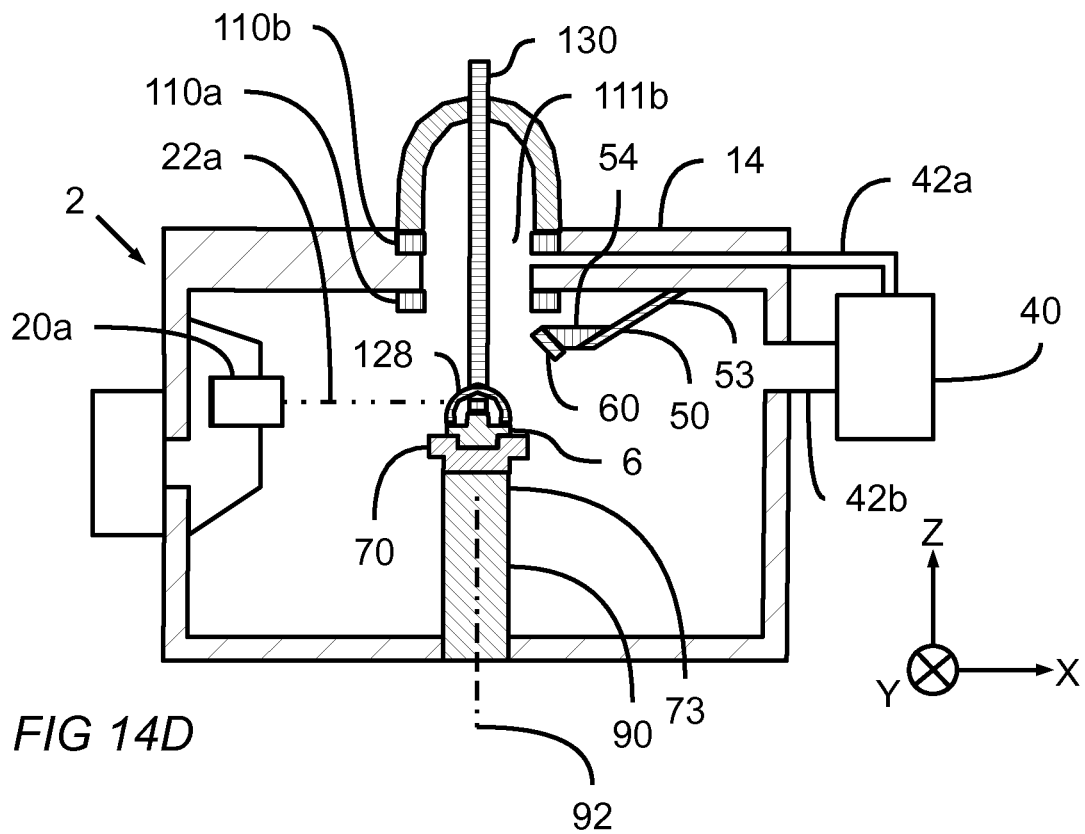

FIG. 14D shows the system of FIG. 14C in which the transfer means 130 may be used to: move inner gripper 128, sample holder 6, and sample 4 towards sample retention stage 70; urge sample holder 6 to engage with sample retention stage 70; and urge inner gripper 128 to disengage from sample holder 6. After disengaging the inner gripper from the sample holder, the transfer means may be used to move the empty inner gripper towards outer vacuum bell 122.

Figure 14E:
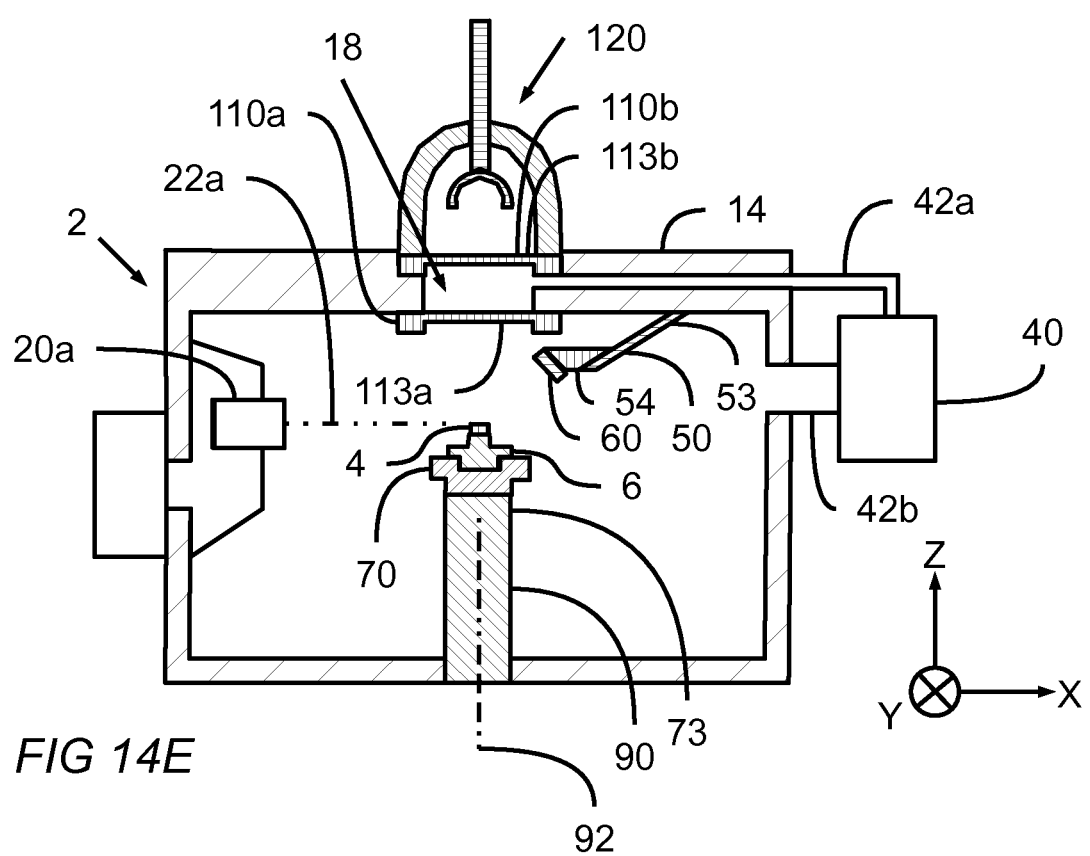

FIG. 14E shows the system of FIG. 14D in which the first gate valve 110a has been operated into first gate-closed position 113a thereby creating a substantially vacuum-tight seal between first gate valve 110a and the portion of vacuum chamber 14 in which ion beam irradiating means 20a is disposed. The system of FIG. 14E may now be operated to prepare a sample and coat a sample in the manner previously described according to the apparatus of FIG. 1A and FIG. 1B.

FIG. 15A shows, with reference to the system of FIGS. 14A-14E, loading sequence 300 comprising the steps of: creating a substantially vacuum-tight loading chamber between the vacuum transfer device and the vacuum chamber 302; at least partially evacuating the loading chamber 304; opening a gate valve between the loading chamber and the transfer chamber 306; opening a gate valve between the loading chamber and the portion of the vacuum chamber in which the sample retention stage is disposed 308; moving the inner gripper from the vacuum transfer device towards sample retention stage 310; engaging sample holder with sample retention stage 312; disengaging inner gripper from the sample holder 314; moving the inner gripper back to the loading chamber 316; closing the gate valve between the loading chamber and the portion of the vacuum chamber in which the sample retention stage is disposed 318.

FIG. 15B shows, with reference to the system of FIGS. 14A-14E unloading sequence 350 comprising the steps of: opening a gate valve between the loading chamber and the portion of the vacuum chamber in which the sample retention stage is disposed 352; moving inner gripper from the loading chamber towards sample retention stage 354; engaging sample holder with inner gripper 356; disengaging sample holder from sample retention stage 358; moving the inner gripper, sample holder, and sample into outer vacuum bell 360; closing a gate valve thereby creating substantially vacuum-tight loading chamber 362, closing a gate valve thereby creating a substantially vacuum-tight transfer chamber 364; returning loading chamber to substantially ambient pressure 366.

Use of the apparatus shown in FIG. 1 through FIG. 11, and FIG. 13 through FIG. 15 may proceed with reference to the following steps: outside of the vacuum chamber a sample may be mounted to a sample holder with a predetermined position and orientation; with the chamber cover removed, the sample and sample holder combination may be set in the sample retention stage; the chamber cover may then be replaced; the vacuum pump means may then be operated to evacuate the vacuum chamber through the pumping manifold, thereby obtaining vacuum levels appropriate for ion beam milling; the ion beam irradiating means may then be operated to prepare the sample; the sample may then be lowered to the coating position; the coating donor translation stage may be operated to move the stage into the coating position; the sample may then be coated with a coating portion of the sputtered coating material.

Although the present invention has been described in considerable detail with reference to certain preferred versions thereof, other versions are possible. It may be desirable to combine features shown in various embodiments into a single embodiment. A different number and configuration of features may be used to construct embodiments of ion beam sample preparation and coating apparatus that are entirely within the spirit and scope of the present disclosure. Therefore, the spirit and scope of the appended claims should not be limited to the description of the preferred versions contained herein.

While various embodiments of the present invention have been disclosed and described in detail herein, it will be apparent to those skilled in the art that various changes may be made to the configuration, operation and form of the invention without departing from the spirit and scope thereof. In particular, it is noted that the respective features of the invention, even those disclosed solely in combination with other features of the invention, may be combined in any configuration excepting those readily apparent to the person skilled in the art as nonsensical. Likewise, use of the singular and plural is solely for the sake of illustration and is not to be interpreted as limiting. Except where the contrary is explicitly noted, the plural may be replaced by the singular and vice-versa.

In the present disclosure, the verb "may" is used to designate optionality/non-compulsoriness. In other words, something that "may" can, but need not. In the present disclosure, the verb "comprise" may be understood in the sense of including. Accordingly, the verb "comprise" does not exclude the presence of other elements/actions. In the present disclosure, relational terms such as "first," "second," "top," "bottom" and the like may be used solely to distinguish one entity or action from another entity or action without necessarily requiring or implying any actual such relationship or order between such entities or actions.

In the present disclosure, the term "any" may be understood as designating any number of the respective elements, e.g. as designating one, at least one, at least two, each or all of the respective elements. Similarly, the term "any" may be understood as designating any collection(s) of the respective elements, e.g. as designating one or more collections of the respective elements, a collection comprising one, at least one, at least two, each or all of the respective elements. The respective collections need not comprise the same number of elements.

In the present disclosure, the expression "at least one" is used to designate any (integer) number or range of (integer) numbers (that is technically reasonable in the given context). As such, the expression "at least one" may, inter alia, be understood as one, two, three, four, five, ten, fifteen, twenty or one hundred. Similarly, the expression "at least one" may, inter alia, be understood as "one or more," "two or more" or "five or more."

In the present disclosure, expressions in parentheses may be understood as being optional. As used in the present disclosure, quotation marks may emphasize that the expression in quotation marks may also be understood in a figurative sense. As used in the present disclosure, quotation marks may identify a particular expression under discussion.

In the present disclosure, many features are described as being optional, e.g. through the use of the verb "may" or the use of parentheses. For the sake of brevity and legibility, the present disclosure does not explicitly recite each and every permutation that may be obtained by choosing from the set of optional features. However, the present disclosure is to be interpreted as explicitly disclosing all such permutations. For example, a system described as having three optional features may be embodied in seven different ways, namely with just one of the three possible features, with any two of the three possible features or with all three of the three possible features.

Any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" in the claims herein is not intended to invoke the provisions of 35 U.S.C. Section 112, Paragraph 6.

The invention claimed is:

1. An ion beam apparatus for preparing a sample and coating said sample with a coating material comprising:
   a) a first ion beam irradiating means disposed in a vacuum chamber directing a first ion beam along a first central ion beam axis;
   b) a coating donor translation stage operable to move between a sputtering position and a quiescent position, said coating donor translation stage coupled to a coating donor holder, said coating donor holder configured to hold said coating material;
      i) wherein in said sputtering position, said coating donor holder positions a portion of said coating material in the path of said first central ion beam axis, the interaction of said first ion beam with said coating material creating a sputtered coating material in said vacuum chamber;
      ii) wherein in said quiescent position, said coating donor holder positions none of said coating material in the path of said first central ion beam axis;
   c) a sample retention stage configured to releasably retain a sample holder which holds said sample in a predetermined position and orientation with respect to said first central ion beam axis, said sample retention stage having: a lifting axis; and a lifting drive;
      i) the lifting drive operable to move said sample retention stage along said lifting axis between a milling position and a coating position;
         A) wherein in said milling position, said sample retention stage is positioned to hold at least a portion of said sample in the path of said first central ion beam axis;
         B) wherein in said sputtering position, said sample retention stage is positioned so that none of said sample intersects said first central ion beam axis and at least a portion of said sample is positioned to receive a coating portion of said sputtered coating material present in said vacuum chamber; and
         C) wherein said first central ion beam axis is the same for said sputtering position and said milling position and wherein said sample retention stage is moved parallel to said lifting axis between said sputtering position and said milling position.

2. The apparatus of claim 1 additionally comprising:
   a) a second ion beam irradiating means disposed in said vacuum chamber directing a second ion beam along a second central ion beam axis;

b) wherein in said sputtering position, said coating donor holder positions a portion of said coating material in the path of said second central ion beam axis, the interaction of said second ion beam with said coating material creating a sputtered coating material in said vacuum chamber;

c) wherein in said quiescent position, said coating donor holder positions none of said coating material in the path of said second central ion beam axis;

d) wherein in said milling position, said sample retention stage is positioned to hold at least a portion of said sample in the path of said second central ion beam axis; and e) wherein in said coating position said sample retention stage is positioned so that none of said sample intersects said second ion beam central axis.

3. The apparatus of claim 1 wherein the first central ion beam axis has a tilt angle with respect to said lifting axis of said sample retention stage, the apparatus additionally comprising a tilt drive operably coupled to the first ion beam irradiating means and configured to move the direction of said first central ion beam axis between at least two different tilt angles.

4. The apparatus of claim 1 additionally comprising:
   a) a sputtering shield having both a shielding position and a non-shielding position;
      i) wherein in said shielding position, said sputtering shield substantially prevents said sample from receiving any of said sputtered coating material present in said vacuum chamber when said sample retention stage is in said coating position;
      ii) wherein in said non-shielding position, said coating portion of said sputtered coating material is received by said sample when said sample retention stage is in said coating position; and
   b) said sputtering shield being operable to move between said shielding position and said non-shielding position when said sample retention stage is in said coating position.

5. The apparatus of claim 1, wherein the sample retention stage is a modulating sample retention stage operable to modulate the position, orientation, or both position and orientation of the sample holder when modulating sample retention stage is in the coating position.

6. The apparatus of claim 1 additionally comprising:
   a) a coating thickness monitor disposed in said vacuum chamber and having a monitoring position in which said coating thickness monitor is disposed to receive a monitoring portion of said sputtered coating material present in said vacuum chamber, said monitoring portion being proportional to said coating portion received by said sample.

7. The apparatus of claim 6 wherein the coating thickness monitor has a shielded position in which said coating thickness monitor receives substantially none of said sputtered coating material present in said vacuum chamber, said coating thickness monitor being operable to move between said monitoring position and said shielded position.

8. An ion beam apparatus for preparing a sample and coating said sample with a coating material comprising:
   a) a first ion beam irradiating means disposed in a vacuum chamber directing a first ion beam along a first central ion beam axis;
   b) a coating donor translation stage operable to move between a sputtering position and a quiescent position, said coating donor translation stage coupled to a coating donor holder, said coating donor holder configured to hold said coating material;
      i) wherein in said sputtering position, said coating donor holder positions a portion of said coating material in the path of said first central ion beam axis, the interaction of said first ion beam with said coating material creating a sputtered coating material in said vacuum chamber;
      ii) wherein in said quiescent position, said coating donor holder positions none of said coating material in the path of said first central ion beam axis;
   c) a rotating sample retention stage configured to releasably retain a sample holder which holds said sample in a predetermined position and orientation with respect to said first central ion beam axis, said sample retention stage having: a lifting axis; and a lifting drive; and a rotation axis;
      i) the lifting drive operable to move said rotating sample retention stage along said lifting axis between a milling position and a coating position
         A) wherein in said milling position, said rotating sample retention stage is positioned to hold at least a portion of said sample in the path of said first central ion beam axis;
         B) wherein in said sputtering position, none of said sample intersects said first ion beam central axis and at least a portion of said sample is positioned to receive a coating portion of said sputtered coating material present in said vacuum chamber;
      ii) said rotating sample retention stage operable to rotate said sample about said rotation axis for at least a portion of one rotation; and
      iii) wherein said first central ion beam axis is the same for said sputtering position and said milling position and wherein said sample retention stage is moved parallel to said lifting axis between said sputtering position and said milling position.

9. An ion beam apparatus for preparing a sample and coating said sample with a coating material comprising:
   a) a first ion beam irradiating means disposed in a vacuum chamber directing a first ion beam along a first central ion beam axis;
   b) a coating donor translation stage operable to move between a sputtering position and a quiescent position, said coating donor translation stage coupled to a coating donor holder, said coating donor holder configured to hold said coating material;
      i) wherein in said sputtering position, said coating donor holder positions a portion of said coating material in the path of said first central ion beam axis, the interaction of said first ion beam with said coating material creating a sputtered coating material in said vacuum chamber;
      ii) wherein in said quiescent position, said coating donor holder positions none of said coating material in the path of said first central ion beam axis;
   c) a sample retention stage configured to releasably retain a sample holder which holds said sample in a predetermined position and orientation with respect to said first central ion beam axis, said sample retention stage having: a lifting axis; and a lifting drive;
      i) said sample holder configured to hold said sample in a predetermined position and orientation;
   d) the lifting drive operable to move said sample retention stage along said lifting axis between a milling position and a coating position i) wherein in said milling position, said sample retention stage is positioned to hold at least a portion of said sample in the path of said first central ion beam axis;

ii) wherein in said sputtering position, said sample retention stage is positioned so that none of said sample intersects said first ion beam central axis and at least a portion of said sample is positioned to receive a coating portion of said sputtered coating material present in said vacuum chamber;

e) a first gate valve operable to move between a gate-open position and a gate-closed position;

i) wherein in said gate-closed position, a substantially vacuum-tight loading chamber is created between the closed first gate valve and a portion of the vacuum chamber;

ii) wherein in said gate-closed position, a substantially vacuum-tight seal is created between the loading chamber and the portion of the vacuum chamber in which the ion beam irradiating means is disposed;

iii) wherein in said gate-open position, said sample holder can pass through said first gate valve; and f) a vacuum pumping means coupled to a first vacuum manifold and configured to evacuate and maintain vacuum pressure in said loading chamber, said vacuum pumping means also coupled to a second vacuum manifold and configured to evacuate and maintain vacuum pressure in said vacuum chamber;

i) wherein said first central ion beam axis is the same for said sputtering position and said milling position and wherein said sample retention stage is moved parallel to said lifting axis between said sputtering position and said milling position.

10. The apparatus of claim 9 additionally comprising:

a) a vacuum transfer device having: an outer vacuum bell, an inner vacuum bell, and a transfer means;

i) said outer vacuum bell being configured to removeably mount to said loading chamber thereby creating a vacuum-tight seal;

ii) said inner vacuum bell sized to fit inside of said outer vacuum bell and configured to create a vacuum-tight seal against said sample holder thereby creating a transfer chamber sized to isolate both said sample and a portion of said sample holder from the environment;

iii) said transfer means being operable to complete both a loading sequence and an unloading sequence while said outer vacuum bell is mounted to said loading chamber;

A) said loading sequence comprising the steps of: moving said inner vacuum bell from said loading chamber towards said sample retention stage; urging the engagement of said sample holder with said sample retention stage; urging the disengagement of inner vacuum bell from said sample holder; and moving said inner vacuum bell back to said loading chamber; and B) said unloading sequence comprising the steps of: moving said inner vacuum bell from said loading chamber towards said sample retention stage; urging the engagement of said sample holder with said inner vacuum bell; urging the disengagement of said sample holder from said sample retention stage; and moving said inner vacuum bell back to said loading chamber.

11. The apparatus of claim 9 additionally comprising:

a) a vacuum transfer device having: an outer vacuum bell coupled to a second gate valve, an inner gripper coupled to a transfer means;

b) said inner gripper sized to fit inside of said outer vacuum bell and configured to releasably retain said sample holder within an interior portion of said outer vacuum bell;

c) said second gate valve coupled to said outer vacuum bell and having both a second gate-closed position and a second gate-open position;

d) wherein in said second gate-closed position, a substantially vacuum-tight transfer chamber is created between the closed second gate valve and an interior portion of the outer vacuum bell;

e) wherein in said second gate-open position, said inner gripper can pass through said second gate valve;

f) said outer vacuum bell being configured to removeably mount to said loading chamber thereby creating a vacuum-tight seal;

g) said transfer means being operable to complete both a loading sequence and an unloading sequence while said outer vacuum bell is mounted to said loading chamber;

i) said loading sequence comprising the steps of: moving said inner gripper from said loading chamber towards said sample retention stage; urging the engagement of said sample holder with said sample retention stage; urging the disengagement of inner gripper from said sample holder; and moving said inner gripper back to said loading chamber; and ii) said unloading sequence comprising the steps of: moving said inner gripper from said loading chamber towards said sample retention stage; urging the engagement of said sample holder with said inner gripper; urging the disengagement of said sample holder from said sample retention stage; and moving said inner gripper back to said loading chamber.

12. An ion beam apparatus for preparing a sample and coating said sample with a coating material comprising:

a) a first ion beam irradiating means disposed in a vacuum chamber directing a first ion beam along a first central ion beam axis;

b) a coating donor translation stage operable to move between a sputtering position and a quiescent position, said coating donor translation stage coupled to a coating donor holder, said coating donor holder configured to hold said coating material;

i) wherein in said sputtering position, said coating donor holder positions a portion of said coating material in the path of said first central ion beam axis, the interaction of said first ion beam with said coating material creating a sputtered coating material in said vacuum chamber;

ii) wherein in said quiescent position, said coating donor holder positions none of said coating material in the path of said first central ion beam axis;

c) a sample retention stage configured to hold said sample and having: a lifting axis; a lifting drive;

i) the lifting drive operable to move said sample retention stage along said lifting axis between: a loading position; a milling position; and a coating position, A) wherein in said loading position, a substantially vacuum-tight loading chamber is created between the sample retention stage and a portion of the vacuum chamber, and a substantially vacuum-tight seal is created between the loading chamber and the portion of the vacuum chamber in which the ion beam irradiating means is disposed;
- B) wherein in said milling position, said sample retention stage is positioned to hold at least a portion of said sample in the path of said first central ion beam axis;
- C) wherein in said sputtering position, none of said sample intersects said first ion beam central axis and at least a portion of said sample is positioned to receive a coating portion of said sputtered coating material present in said vacuum chamber; and
- d) a vacuum pumping means coupled to a first vacuum manifold and configured to evacuate and maintain vacuum pressure in said loading chamber, said vacuum pumping means also coupled to a second vacuum manifold and configured to evacuate and maintain vacuum pressure in said vacuum chamber;
  - i) wherein said first central ion beam axis is the same for said sputtering position and said milling position and wherein said sample retention stage is moved parallel to said lifting axis between said sputtering position and said milling position.

13. An ion beam apparatus for preparing a sample and coating said sample with a coating material comprising:
- a) a first ion beam irradiating means disposed in a vacuum chamber directing a first ion beam along a first central ion beam axis;
- b) a coating donor translation stage operable to move between a sputtering position and a quiescent position, said coating donor translation stage coupled to a coating donor holder, said coating donor holder configured to hold said coating material;
  - i) wherein in said sputtering position, said coating donor holder positions a portion of said coating material in the path of said first central ion beam axis, the interaction of said first ion beam with said coating material creating a sputtered coating material in said vacuum chamber;
  - ii) wherein in said quiescent position, said coating donor holder positions none of said coating material in the path of said first central ion beam axis;
- c) a sample retention stage configured to releasably retain a secondary sample holder, the sample retention stage having: a lifting axis and a lifting drive;
  - i) said secondary sample holder configured to releasably retain a primary sample holder in a predetermined position and orientation;
    - A) said primary sample holder configured to retain said sample in a predetermined position and orientation; wherein said primary sample holder can be released from said secondary sample holder without releasing said secondary sample holder from said sample retention stage;
  - ii) the lifting drive operable to move said sample retention stage along said lifting axis between a milling position and a coating position;
    - A) wherein in said milling position, said sample retention stage is positioned to hold at least a portion of said sample in the path of said first central ion beam axis;
    - B) wherein in said sputtering position, said sample retention stage is positioned so that none of said sample intersects said first central ion beam axis and at least a portion of said sample is positioned to receive a coating portion of said sputtered coating material present in said vacuum chamber; and
    - C) wherein said first central ion beam axis is the same for said sputtering position and said milling position and wherein said sample retention stage is moved parallel to said lifting axis between said sputtering position and said milling position.

* * * * *